(12) United States Patent
Yamazaki et al.

(10) Patent No.: US 10,014,413 B2
(45) Date of Patent: Jul. 3, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Hideomi Suzawa, Kanagawa (JP); Yutaka Okazaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/618,480

(22) Filed: Jun. 9, 2017

(65) Prior Publication Data

US 2017/0278978 A1 Sep. 28, 2017

Related U.S. Application Data

(63) Continuation of application No. 15/145,896, filed on May 4, 2016, now Pat. No. 9,680,024, which is a
(Continued)

(30) Foreign Application Priority Data

May 20, 2013 (JP) .................................. 2013-106359
May 20, 2013 (JP) .................................. 2013-106378

(51) Int. Cl.
*H01L 29/12* (2006.01)
*H01L 29/10* (2006.01)
(Continued)

(52) U.S. Cl.
CPC .... *H01L 29/78606* (2013.01); *H01L 27/1052* (2013.01); *H01L 29/42384* (2013.01);
(Continued)

(58) Field of Classification Search
CPC ........... H01L 29/78606; H01L 27/1052; H01L 29/785; H01L 29/4908; H01L 29/66969;
(Continued)

(56) References Cited

U.S. PATENT DOCUMENTS 5,731,856 A   3/1998  Kim et al.
5,744,864 A   4/1998  Cillessen et al.
(Continued)

FOREIGN PATENT DOCUMENTS

EP    1737044 A    12/2006
EP    2226847 A     9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Victor A Mandala
(74) *Attorney, Agent, or Firm* — Nixon Peabody LLP; Jeffrey L. Costellia

(57) ABSTRACT

To provide a semiconductor device that includes an oxide semiconductor and is miniaturized while keeping good electrical properties. In the semiconductor device, an oxide semiconductor layer filling a groove is surrounded by insulating layers including an aluminum oxide film containing excess oxygen. Excess oxygen contained in the aluminum oxide film is supplied to the oxide semiconductor layer, in which a channel is formed, by heat treatment in a manufacturing process of the semiconductor device. Moreover, the aluminum oxide film forms a barrier against oxygen and hydrogen, which inhibits the removal of oxygen from the oxide semiconductor layer surrounded by the insulating
(Continued)

layers including an aluminum oxide film and the entry of impurities such as hydrogen in the oxide semiconductor layer. Thus, a highly purified intrinsic oxide semiconductor layer can be obtained. The threshold voltage is controlled effectively by gate electrode layers formed over and under the oxide semiconductor layer.

16 Claims, 21 Drawing Sheets

Related U.S. Application Data continuation of application No. 14/279,374, filed on May 16, 2014, now Pat. No. 9,343,579.

(51) Int. Cl.
*H01L 29/786* (2006.01)
*H01L 29/51* (2006.01)
*H01L 27/105* (2006.01)
*H01L 29/78* (2006.01)
*H01L 29/66* (2006.01)
*H01L 29/49* (2006.01)
*H01L 29/423* (2006.01)

(52) U.S. Cl.
CPC ........ *H01L 29/4908* (2013.01); *H01L 29/517* (2013.01); *H01L 29/66969* (2013.01); *H01L 29/785* (2013.01); *H01L 29/7869* (2013.01); *H01L 29/78603* (2013.01); *H01L 29/78648* (2013.01); *H01L 29/78696* (2013.01)

(58) Field of Classification Search
CPC ......... H01L 29/78603; H01L 29/42384; H01L 29/78648; H01L 29/78696; H01L 29/517; H01L 29/7869
See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,384,085 B2 | 2/2013 | Taniguchi et al. |
| 8,634,230 B2 | 1/2014 | Uochi |
| 8,692,252 B2 | 4/2014 | Takata et al. |
| 8,878,173 B2 | 11/2014 | Yamazaki |
| 9,449,991 B2 | 9/2016 | Yamazaki |
| 9,691,772 B2 | 6/2017 | Noda et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089486 A1* | 4/2011 | Xu .................... H01L 29/66734 257/330 |
| 2011/0140100 A1 | 6/2011 | Takata et al. |
| 2012/0001170 A1 | 1/2012 | Yarnazakis |
| 2012/0156844 A1* | 6/2012 | Kim .................. H01L 27/10823 438/270 |
| 2012/0187410 A1 | 7/2012 | Yamazaki et al. |
| 2012/0194262 A1 | 8/2012 | Uochi |
| 2012/0223310 A1 | 9/2012 | Noda et al. |
| 2012/0235150 A1 | 9/2012 | Isobe et al. |

(56) References Cited

U.S. PATENT DOCUMENTS

| | | | |
|---|---|---|---|
| 2013/0065384 A1* | 3/2013 | Hiyoshi | H01L 21/3065 438/589 |
| 2013/0069146 A1* | 3/2013 | Okumura | H01L 21/2257 257/330 |
| 2013/0168760 A1* | 7/2013 | Hsieh | H01L 29/407 257/330 |
| 2013/0168767 A1* | 7/2013 | Lin | H01L 27/0727 257/337 |
| 2013/0196468 A1 | 8/2013 | Yamazaki | |
| 2014/0145184 A1* | 5/2014 | Amano | H01L 21/28008 257/43 |
| 2014/0339538 A1 | 11/2014 | Yamazaki et al. | |
| 2014/0339549 A1* | 11/2014 | Yamazaki | H01L 29/7869 257/43 |
| 2015/0187952 A1 | 7/2015 | Yamazaki et al. | |
| 2017/0256547 A1 | 9/2017 | Noda et al. | |
| 2017/0322177 A1* | 11/2017 | Kalnitsky | G01N 27/4148 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-095062 A | 4/1996 |
| JP | 08-264794 A | 10/1996 |
| JP | 09-139508 A | 5/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-139743 A | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-124360 A | 6/2011 |
| JP | 2011-138934 A | 7/2011 |
| JP | 2012-033908 A | 2/2012 |
| JP | 2012-169609 A | 9/2012 |
| JP | 2012-195574 A | 10/2012 |
| WO | WO-2004/114391 | 12/2004 |
| WO | WO-2009/133891 | 11/2009 |
| WO | WO-2012/002292 | 1/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposoum Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

(56) References Cited

OTHER PUBLICATIONS

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

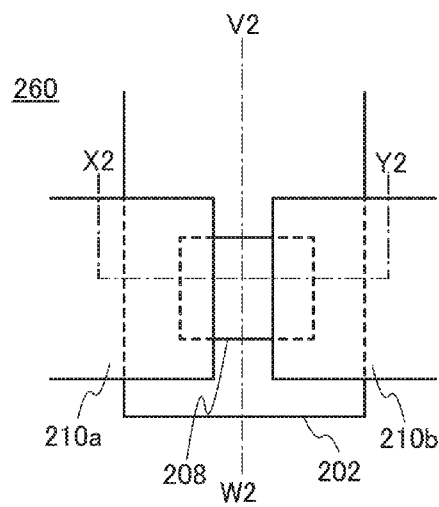
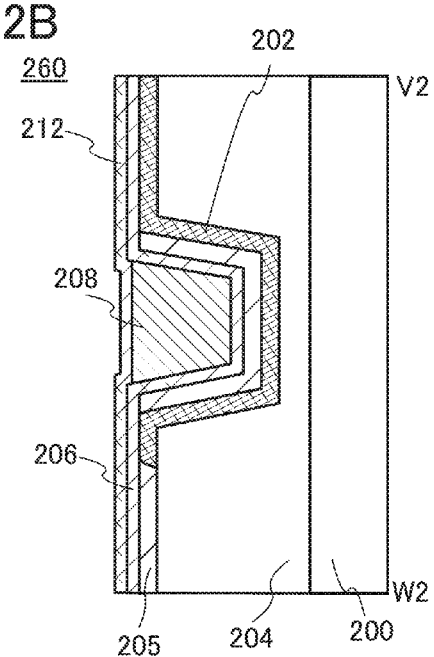
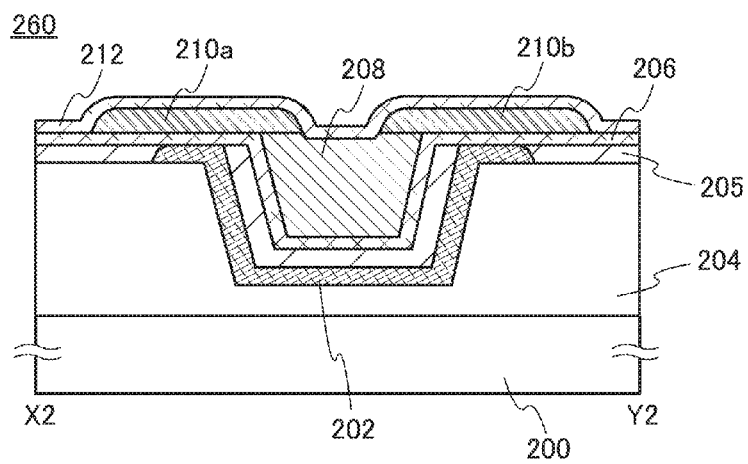

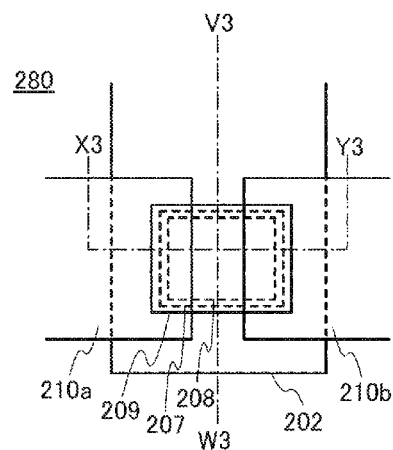
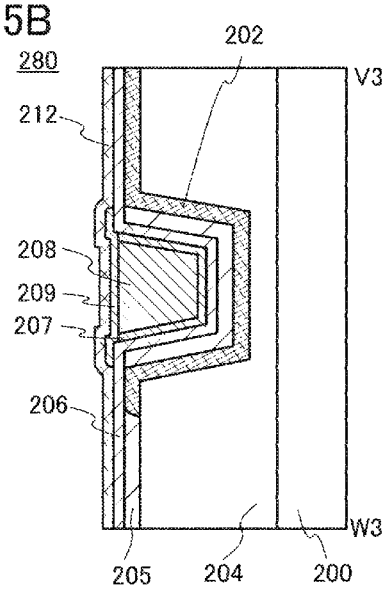
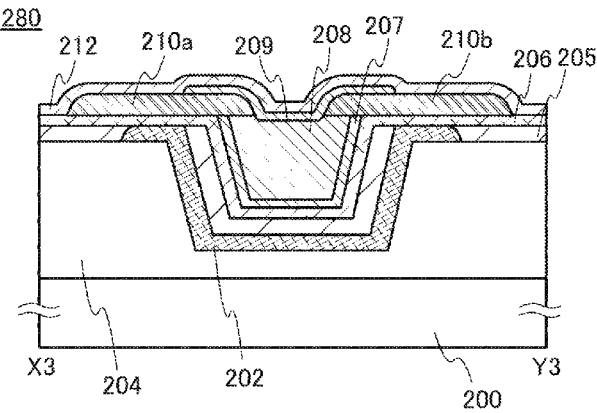
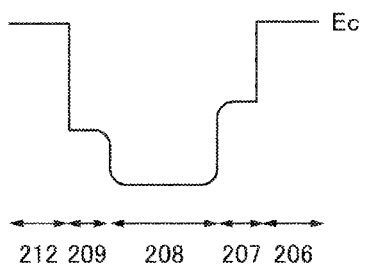

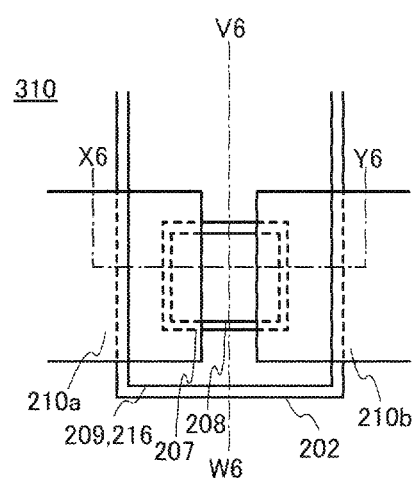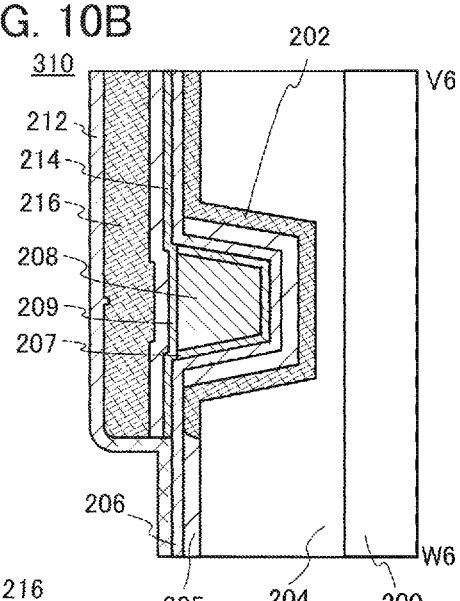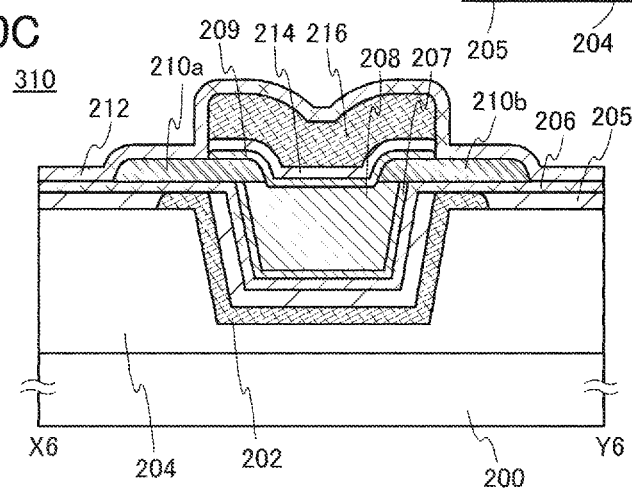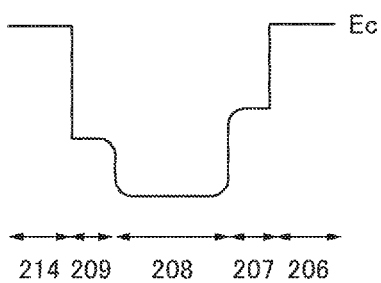

SEMICONDUCTOR DEVICE

BACKGROUND OF THE INVENTION

1. Field of the Invention

The invention disclosed in this specification and the like relates to a semiconductor device and a method for manufacturing the semiconductor device.

In this specification and the like, a semiconductor device refers to all types of devices that can function by utilizing semiconductor characteristics, and includes in its category an electro-optical device, an image display device, a semiconductor circuit, and an electronic device.

2. Description of the Related Art

Attention has been drawn to a technique of forming transistors with use of semiconductor thin films formed over a substrate having an insulating surface. These transistors are widely used for electronic devices such as an integrated circuit (IC) and an image display device (also simply referred to as a display device). Although a silicon-based semiconductor material is a common material for a semiconductor thin film applicable to a transistor, an oxide semiconductor has been attracting attention as another material.

For example, a technique of forming a transistor with use of an oxide semiconductor such as zinc oxide or an In—Ga—Zn-based oxide semiconductor is disclosed (see Patent Documents 1 and 2).

Another technique is also disclosed: oxide semiconductor layers with different electron affinities (or lower levels of the conduction hands) are stacked to increase the carrier mobility of a transistor (see Patent Documents 3 and 4).

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-124360
[Patent Document 4] Japanese Published Patent Application No. 2011-138934

SUMMARY OF THE INVENTION

The reliability of semiconductor devices including transistors using an oxide semiconductor certainly needs to be improved for mass production. In particular, a decrease in reliability is caused by a variation or decrease in the electrical characteristics of the semiconductor devices.

In view of the above, an object of one embodiment of the present invention is to provide a highly reliable semiconductor device including an oxide semiconductor.

Miniaturization of a transistor is also essential for achieving high-speed operation, low power consumption, low costs, high integration, and the like of the transistor.

Thus, another object of one embodiment of the present invention is to provide a semiconductor device that includes an oxide semiconductor and is miniaturized while keeping good electrical properties.

Note that the descriptions of these objects do not disturb the existence of other objects. In one embodiment of the present invention, there is no need to achieve all the objects. Other objects are apparent from and can be derived from the description of the specification and the like.

In the case where a transistor is formed using an oxide semiconductor, an oxygen vacancy serves as a source of carriers in the oxide semiconductor. Oxygen vacancies in the oxide semiconductor appear as localized states in deep energy levels in the energy gap of the oxide semiconductor. When carriers are trapped by such localized states, the electrical characteristics of the transistor degrade; for example, the transistor becomes normally-on, or has an increased leakage current or a threshold voltage shifted by stress application. It is thus necessary to reduce the amount of oxygen vacancies in the oxide semiconductor in order to improve the reliability of the transistor.

In an oxide semiconductor layer, hydrogen, silicon, nitrogen, carbon, and metal elements except for the main components are impurities. For example, part of hydrogen in the oxide semiconductor layer forms a donor level to increase carrier density.

Therefore, in order that a semiconductor device including an oxide semiconductor can have stable electrical characteristics, some measures need to be taken to reduce oxygen vacancies in the oxide semiconductor layer with a sufficient supply of oxygen and to reduce the concentration of impurities such as hydrogen.

In a semiconductor device of one embodiment of the present invention, oxygen is supplied to a channel formation region from a gate insulating layer under an oxide semiconductor layer and an insulating layer serving as a protective insulating layer over the oxide semiconductor layer, thereby filling oxygen vacancies which might be caused in the channel formation region.

In one embodiment of the present invention, an insulating layer including an aluminum oxide film containing excess oxygen is used as the gate insulating layer and the protective insulating layer which supply oxygen to the channel formation region. Here, excess oxygen refers to, for example, oxygen in excess of the stoichiometric composition, or oxygen that can be released by heating at a temperature lower than or equal to that of heat treatment in a manufacturing process of a semiconductor device. For example, an $AlO_x$ (x is greater than 1.5) film can be provided as an aluminum oxide film containing excess oxygen. Excess oxygen contained in the aluminum oxide film can be released by heating to be supplied to the oxide semiconductor layer. Therefore, oxygen can be effectively supplied to the channel formation region when the insulating layer including such an aluminum oxide film is provided under and over the oxide semiconductor layer.

The aluminum oxide film containing excess oxygen can be formed by a sputtering method or the like in an atmosphere containing oxygen.

The aluminum oxide film is an insulating layer whose oxygen and hydrogen permeability is lower than that of an insulating layer such as a silicon oxide film or a silicon oxynitride film or an oxide semiconductor layer. That is, the aluminum oxide film forms a barrier against oxygen and hydrogen. An insulating layer including the aluminum oxide film thus inhibits generation of oxygen vacancies due to removal of oxygen from a region surrounded by the insulating layer, and inhibits entry of hydrogen or a hydrogen compound.

In one embodiment of the present invention, a gate insulating layer provided on one of the top and bottom sides of an oxide semiconductor layer and a protective insulating layer provided on the other side of the oxide semiconductor layer are in contact with each other in a region where the oxide semiconductor layer, and a source electrode layer and a drain electrode layer electrically connected to the oxide semiconductor layer do not exist. In other words, in the semiconductor device of one embodiment of the present invention, the oxide semiconductor layer is surrounded by the aluminum oxide film. With such a structure, removal of oxygen and/or entry of impurities such as hydrogen can be minimized and oxygen can be supplied not only on a front channel side and a back channel side of the oxide semiconductor layer but also on a side surface of the oxide semiconductor layer. It is thus possible to reduce variation in the electrical characteristics of a transistor in which a channel is formed in the oxide semiconductor layer, offering a highly reliable semiconductor device.

More specifically, the following structures can be employed, for example.

One embodiment of the present invention is a semiconductor device including a first insulating layer having a groove; a gate electrode layer positioned at least in a bottom of the groove; a gate insulating layer which is provided in contact with the gate electrode layer so as to cover the groove and at least part of a top surface of the first insulating layer; an oxide semiconductor layer which overlaps with the gate electrode layer with the gate insulating layer interposed therebetween and fills the groove; a source electrode layer and a drain electrode layer which are provided over the first insulating layer with the gate insulating layer interposed therebetween and are electrically connected to the oxide semiconductor layer; and a second insulating layer which is provided over the gate insulating layer so as to cover the source electrode layer and the drain electrode layer. The gate insulating layer and the second insulating layer each include an aluminum oxide film containing excess oxygen, and are in contact with each other in a region where the source electrode layer and the drain electrode layer do not exist.

One embodiment of the present invention is a semiconductor device including a first insulating layer having a groove; a gate electrode layer in contact with a side surface and a bottom surface of the groove; a gate insulating layer which is provided in contact with the gate electrode layer so as to cover the groove and at least part of a top surface of the first insulating layer; an oxide semiconductor layer which overlaps with the gate electrode layer with the gate insulating layer interposed therebetween and fills the groove; a source electrode layer and a drain electrode layer which are provided over the first insulating layer with the gate insulating layer interposed therebetween and are electrically connected to the oxide semiconductor layer; and a second insulating layer which is provided over the gate insulating layer so as to cover the source electrode layer and the drain electrode layer. The gate insulating layer and the second insulating layer each include an aluminum oxide film containing excess oxygen, and are in contact with each other in a region where the source electrode layer and the drain electrode layer do not exist.

In the aforementioned semiconductor device, the gate insulating layer preferably covers a side surface and a bottom surface of the oxide semiconductor layer in the groove.

The aforementioned semiconductor device preferably further includes a first oxide layer which is between the gate insulating layer and the oxide semiconductor layer and includes as a constituent element at least one of metal elements contained in the oxide semiconductor layer; and a second oxide layer which is between the second insulating layer and the oxide semiconductor layer and includes as a constituent element at least one of metal elements contained in the oxide semiconductor layer. The energy at the bottom of the conduction band of the oxide semiconductor layer is preferably closer to the vacuum level than the energy at the bottom of the conduction band of the first and second oxide layers is by greater than or equal to 0.05 eV and less than or equal to 2 eV.

In the aforementioned semiconductor device, the second oxide layer may be provided over the source electrode layer and the drain electrode layer so as to cover the oxide semiconductor layer not covered with the source electrode layer and the drain electrode layer.

One embodiment of the present invention is a semiconductor device including a first insulating layer having a groove; a first gate electrode layer positioned at least in a bottom of the groove; a first gate insulating layer which is provided in contact with the first gate electrode layer so as to cover the groove and at least part of a top surface of the first insulating layer; an oxide semiconductor layer which overlaps with the first gate electrode layer with the first gate insulating layer interposed therebetween and fills the groove; a source electrode layer and a drain electrode layer which are provided over the first insulating layer with the first gate insulating layer interposed therebetween and are electrically connected to the oxide semiconductor layer; a second gate insulating layer which is over the source electrode layer and the drain electrode layer and overlaps with the oxide semiconductor layer; a second gate electrode layer which overlaps with the oxide semiconductor layer with the second gate insulating layer interposed therebetween; and a second insulating layer which covers the source electrode layer, the drain electrode layer, and the second gate electrode layer. The first gate insulating layer and the second insulating layer each include an aluminum oxide film containing excess oxygen, and are in contact with each other in a region where the source electrode layer, the drain electrode layer, and the second gate electrode layer do not exist.

One embodiment of the present invention is a semiconductor device including a first insulating layer having a groove; a first gate electrode layer in contact with a side surface and a bottom surface of the groove; a first gate insulating layer which is provided in contact with the first gate electrode layer so as to cover the groove and at least part of a top surface of the first insulating layer; an oxide semiconductor layer which overlaps with the first gate electrode layer with the first gate insulating layer interposed therebetween and fills the groove; a source electrode layer and a drain electrode layer which are provided over the first insulating layer with the first gate insulating layer interposed therebetween and are electrically connected to the oxide semiconductor layer; a second gate insulating layer which is over the source electrode layer and the drain electrode layer and overlaps with the oxide semiconductor layer; a second gate electrode layer which overlaps with the oxide semiconductor layer with the second gate insulating layer interposed therebetween; and a second insulating layer which covers the source electrode layer, the drain electrode layer, and the second gate electrode layer. The first gate insulating layer and the second insulating layer each include an aluminum oxide film containing excess oxygen, and are in contact with each other in a region where the source electrode layer, the drain electrode layer, and the second gate electrode layer do not exist.

In the aforementioned semiconductor device, the first gate insulating layer preferably covers a side surface and a bottom surface of the oxide semiconductor layer in the groove.

The aforementioned semiconductor device preferably further includes a first oxide layer which is between the first gate insulating layer and the oxide semiconductor layer and includes as a constituent element at least one of metal elements contained in the oxide semiconductor layer; and a second oxide layer which is between the second gate insulating layer and the oxide semiconductor layer and includes as a constituent element at least one of metal elements contained in the oxide semiconductor layer. The energy at the bottom of the conduction band of the oxide semiconductor layer is preferably closer to the vacuum level than the energy at the bottom of the conduction band of the first and second oxide layers is by greater than or equal to 0.05 eV and less than or equal to 2 eV.

In the aforementioned semiconductor device, the second oxide layer may be provided over the source electrode layer and the drain electrode layer so as to cover the oxide semiconductor layer not covered with the source electrode layer and the drain electrode layer.

The structure of one embodiment of the present invention produces the following effects, for example.

In the semiconductor device of one embodiment of the present invention, an oxide semiconductor layer is surrounded by insulating layers including an aluminum oxide film containing excess oxygen. Excess oxygen contained in the aluminum oxide film is supplied to the oxide semiconductor layer, in which a channel is to be formed, by heat treatment in a manufacturing process of the semiconductor device. Moreover, the aluminum oxide film forms a barrier against oxygen and hydrogen, which inhibits the removal of oxygen from the oxide semiconductor layer surrounded by the insulating layer including an aluminum oxide film and the entry of impurities such as hydrogen in the oxide semiconductor layer. The oxide semiconductor layer supplied with sufficient oxygen and blocking entry of impurities such as hydrogen is a highly purified intrinsic oxide semiconductor layer.

In the aforementioned semiconductor device, the insulating layer including an aluminum oxide film that is under the oxide semiconductor layer functions as a gate insulating layer. The gate electrode layer overlapping with the oxide semiconductor layer with the gate insulating layer interposed therebetween is preferably provided so as to overlap with a side surface and a bottom surface of a channel formation region in the oxide semiconductor layer. For example, the gate electrode layer is formed over the first insulating layer having a groove (a trench) so as to be in contact with a side surface and a bottom surface of the groove, the gate insulating layer is formed over the gate electrode layer so as to cover the groove, and the oxide semiconductor layer is formed over the gate insulating layer so as to fill the groove. As a result, it is possible to obtain the gate electrode layer which overlaps with the side surface and bottom surface of the oxide semiconductor layer. In such a structure, an electric field can be applied to the channel formation region both in the direction of the side surface and in the direction of the bottom surface, allowing the threshold voltage of a transistor to be controlled effectively and the subthreshold swing (S value) to be reduced.

In the aforementioned semiconductor device, an electric field is applied to the oxide semiconductor layer vertically from the first gate electrode layer under the oxide semiconductor layer and the second gate electrode layer over the oxide semiconductor layer; as a result, the threshold voltage of the semiconductor device can be controlled effectively. Moreover, the first gate electrode layer is provided to cover a side surface of the oxide semiconductor layer with the first gate insulating layer interposed therebetween. Accordingly, the electric field can be applied to a channel formation region in both the vertical and horizontal directions, allowing the threshold voltage of a transistor to be controlled more effectively and the S value to be reduced.

The first gate electrode layer overlapping with the side surface and bottom surface of the oxide semiconductor layer with the first gate insulating layer interposed therebetween can be formed in the following manner, for example. The first gate electrode layer is formed over the first insulating layer having a groove (a trench) so as to be in contact with a side surface and a bottom surface of the groove, the first gate insulating layer is formed over the first gate electrode layer so as to cover the groove, and the oxide semiconductor layer is formed over the first gate insulating layer so as to fill the groove.

In the semiconductor device of one embodiment of the present invention, the oxide layer including as a constituent element at least one of metal elements contained in the oxide semiconductor layer is preferably provided between the oxide semiconductor layer and each of the gate insulating layer and the protective insulating layer which overlap with the oxide semiconductor layer. This suppresses the formation of trap states at the interfaces between the oxide semiconductor layer and each of the insulating layers overlapping with the oxide semiconductor layer. As a result, deterioration of the electrical characteristics of the transistor can be minimized.

That is, one embodiment of the present invention preferably has the following structure. The top surface and bottom surface of an oxide semiconductor layer are covered with an oxide layer serving as a barrier film for preventing generation of interface states in the oxide semiconductor layer; a side surface of the oxide semiconductor layer in the channel width direction and the bottom surface thereof are covered with a gate electrode layer with a gate insulating layer interposed therebetween; and the oxide semiconductor layer is surrounded by insulating layers including an aluminum oxide film. Such a structure makes it possible to inhibit the generation of oxygen vacancies producing carriers and the entry of impurities in the oxide semiconductor layer and at the interface with the oxide semiconductor layer. Thus, a highly purified intrinsic oxide semiconductor layer can be obtained. The highly purified intrinsic oxide semiconductor layer refers to an intrinsic or substantially intrinsic oxide semiconductor layer. It is thus possible to reduce variation in the electrical characteristics of a transistor including the oxide semiconductor layer and to provide a highly reliable semiconductor device.

One embodiment of the present invention allows for providing a highly reliable semiconductor device including an oxide semiconductor.

One embodiment of the present invention also allows for providing a semiconductor device that includes an oxide semiconductor and is miniaturized while keeping good electrical properties.

BRIEF DESCRIPTION OF THE DRAWINGS

In the accompanying drawings:

FIGS. 2A to 2C are a plan view and cross-sectional views illustrating one embodiment of a semiconductor device;

FIGS. 5A to 5C are a plan view and cross-sectional views illustrating one embodiment of a semiconductor device, and FIG. 5D is a band diagram;

FIGS. 10A to 10C are a plan view and cross-sectional views illustrating one embodiment of a semiconductor device, and FIG. 10D is a band diagram;

DETAILED DESCRIPTION OF THE INVENTION

Figure 1A:
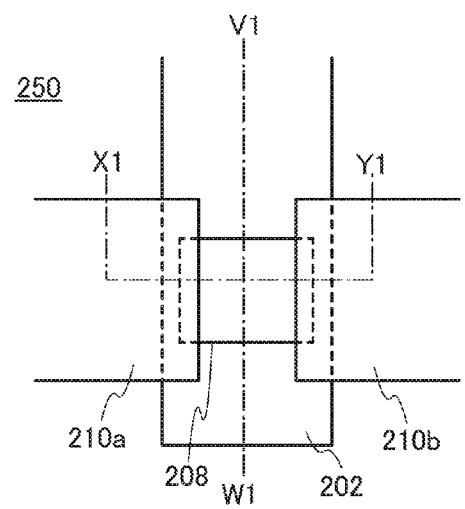
FIGS. 1A to 1C are a plan view and cross-sectional views illustrating one embodiment of a semiconductor device.

Hereinafter, embodiments of the disclosed invention will be described in detail with reference to the accompanying drawings. Note that the invention disclosed in this specification is not limited to the following description, and it is easily understood by those skilled in the art that modes and details of the invention can be modified in various ways. Therefore, the invention disclosed in this specification is not construed as being limited to the description of the following embodiments. Note that in the structures of one embodiment of the present invention described below, the same portions or portions having similar functions are denoted by the same reference numerals in different drawings, and description thereof is not repeated. Furthermore, the same hatching pattern is applied to portions having similar functions, and the portions are not especially denoted by reference numerals in some cases.

In this specification and the like, ordinal numbers such as "first" and "second" are used in order to avoid confusion among components and do not limit the number.

In this specification and the like, a substantially intrinsic oxide semiconductor layer has a carrier density lower than $1 \times 10^{17}/cm^3$, lower than $1 \times 10^{15}/cm^3$, or lower than $1 \times 10^{13}/cm^3$. With a highly purified intrinsic oxide semiconductor layer, a transistor can have stable electrical characteristics.

In this specification and the like, the terms "over" and "under" do not necessarily mean "directly on" and "directly under", respectively, in the description of a positional relationship between components. For example, the expression "a gate electrode over a gate insulating layer" does not exclude the case where a component is placed between the gate insulating layer and the gate electrode. The same applies to the term "under".

In this specification and the like, a top surface of a film refers to one of the surfaces substantially parallel to a substrate surface that is farther from the substrate surface; and a bottom surface of the film refers to the other of the surfaces substantially parallel to the substrate surface that is closer to the substrate surface.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

(Embodiment 1)

In this embodiment, one embodiment of a semiconductor device and a method for manufacturing the semiconductor device will be described with reference to FIGS. 1A to 1C, FIGS. 2A to 2C, FIGS. 3A to 3C, and FIGS. 4A to 4C. In this embodiment, a transistor including an oxide semiconductor is shown as an example of the semiconductor device.

Figure 1B:
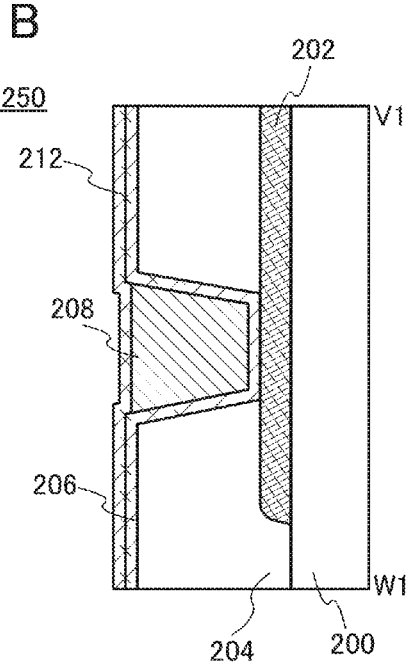
Figure 1C:
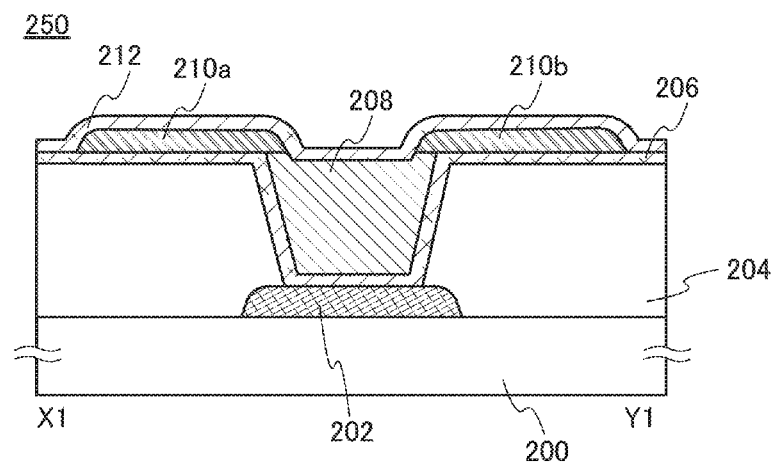

FIGS. 1A to 1C illustrate an example of a structure of a transistor 250. FIG. 1A is a plan view of the transistor 250, FIG. 1B is a cross-sectional view taken along line V1-W1 in FIG. 1A, and FIG. 1C is a cross-sectional view taken along line X1-Y1 in FIG. 1A. Note that in FIG. 1A, some components of the transistor 250 (e.g., an insulating layer 212) are not illustrated to avoid complexity. The same applies to the other plan views in this specification.

The transistor 250 illustrated in FIGS. 1A to 1C includes a gate electrode layer 202 over a substrate 200; an insulating layer 204 having an island-like groove; an insulating layer 206 which is provided in contact with the gate electrode layer 202 so as to cover the groove and at least part of a top surface of the insulating layer 204; an oxide semiconductor layer 208 which overlaps with the gate electrode layer 202 with the insulating layer 206 interposed therebetween and fills the groove in the insulating layer 204; a source electrode layer 210a and a drain electrode layer 210b which are electrically connected to the oxide semiconductor layer 208 and provided over the insulating layer 204 with the insulating layer 206 interposed therebetween; and the insulating layer 212 provided over the insulating layer 206 so as to cover the source electrode layer 210a and the drain electrode layer 210b.

In the transistor 250, an insulating layer including an aluminum oxide film containing excess oxygen is used as the insulating layer 206 serving as a gate insulating layer, which is under the oxide semiconductor layer 208 and covers a side surface and a bottom surface of the oxide semiconductor layer 208, and the insulating layer 212 serving as a protective insulating layer, which is over the oxide semiconductor layer 208 and in contact with part of the oxide semiconductor layer 208. In addition, as illustrated in the cross-sectional views of FIGS. 1B and 1C, in both a channel length direction (the direction in which carriers flow) and a channel width direction, the insulating layer 206 serving as the gate insulating layer and the insulating layer 212 serving as the protective insulating layer are in contact with each other in a region where the oxide semiconductor layer 208, the source electrode layer 210*a*, and the drain electrode layer 210*b* do not exist. In other words, the oxide semiconductor layer 208 in the transistor 250 is surrounded by the insulating layers including an aluminum oxide film.

As mentioned above, excess oxygen contained in the aluminum oxide film is released by heat treatment in a manufacturing process of the transistor 250 to be supplied to the oxide semiconductor layer 208. Heat treatment for forming an insulating layer and the like over the oxide semiconductor layer 208 can also serve as this heat treatment. The aluminum oxide film forms a barrier against oxygen and hydrogen. Accordingly, the amount of oxygen vacancies is reduced in the oxide semiconductor layer 208 because removal of oxygen is minimized and a sufficient amount of oxygen is supplied thereto, and furthermore, entry of impurities such as hydrogen is reduced in the oxide semiconductor layer 208. That is, the oxide semiconductor layer 208 is a highly purified intrinsic oxide semiconductor layer. The transistor 250 including the highly purified and i-type (intrinsic) oxide semiconductor layer 208 has little variation in electrical characteristics and is electrically stable.

In order to make the oxide semiconductor layer 208 intrinsic or substantially intrinsic, the concentration of hydrogen, which is measured by secondary ion mass spectrometry (SIMS), is set to be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, and still more preferably lower than or equal to $5 \times 10^{18}$ atoms/cm$^3$.

The concentration of hydrogen is preferably reduced in the insulating layers 206 and 212 surrounding the oxide semiconductor layer 208. Specifically, the concentration of hydrogen in the insulating layers 206 and 212 is preferably lower than $5 \times 10^{19}$ atoms/cm$^3$, more preferably lower than $5 \times 10^{18}$ atoms/cm$^3$.

The transistor 250 in which the highly purified oxide semiconductor layer 208 is used for a channel formation region has an extremely low off-state current. For example, the drain current when the transistor including a highly purified oxide semiconductor layer is in an off state can be lower than or equal to $1 \times 10^{-18}$ A, preferably lower than or equal to $1 \times 10^{-21}$ A, and more preferably lower than or equal to $1 \times 10^{-24}$ A at room temperature (approximately 25° C.), or the drain current can be lower than or equal to $1 \times 10^{-15}$ A, preferably lower than or equal to $1 \times 10^{-18}$ A, and more preferably lower than or equal to $1 \times 10^{-21}$ A at 85° C. Note that the off state of an n-channel transistor refers to a state where the gate voltage is sufficiently lower than the threshold voltage. Specifically, the transistor is in the off state when the gate voltage is lower than the threshold voltage by 1 V or more, 2 V or more, or 3 V or more.

In the transistor 250, the oxide semiconductor layer 208 is provided so as to fill the groove in the insulating layer 204. When the oxide semiconductor layer 208 is formed in the groove in the insulating layer 204, a thin insulating layer such as the protective insulating layer can be provided over the oxide semiconductor layer with good coverage even though the thickness of the oxide semiconductor layer increases. Furthermore, it is possible to achieve an increase in the density (higher integration) of the transistor 250.

Miniaturization of a transistor leads to an increase in density (higher integration). For example, the channel length of the transistor is made less than or equal to 100 nm, preferably less than or equal to 40 nm, and more preferably less than or equal to 30 nm.

When the channel length and channel width of a transistor are minimized, a wiring, a semiconductor layer, and the like processed using a resist mask have round edges (curved edges) in some cases. It is preferable that the wiring, the semiconductor layer, and the like have round edges because the coverage with the insulating layer formed thereover can be improved.

An increase in the density (higher integration) of a semiconductor device certainly needs miniaturization of a transistor. However, it is known that a miniaturized transistor has degraded electrical characteristics. For example, short-channel effects are known to occur due to a shortened channel length of a transistor including silicon, in which case the subthreshold swing (S value) increases, or the threshold voltage shifts in the negative direction.

However, a transistor including an oxide semiconductor is an accumulation-type transistor whose majority carriers are electrons; therefore, drain-induced barrier lowering (DIBL) as a short-channel effect is less likely to occur than in an inversion-type transistor such as a silicon transistor. In other words, the transistor including an oxide semiconductor is unlikely to suffer the short-channel effects, and is suitable for miniaturization.

FIGS. 2A to 2C illustrate an example of a structure of a transistor 260 as another example of the transistor of this embodiment. FIG. 2A is a plan view of the transistor 260, FIG. 2B is a cross-sectional view taken along line V2-W2 in FIG. 2A, and FIG. 2C is a cross-sectional view taken along line X2-Y2 in FIG. 2A.

The transistor 260 illustrated in FIGS. 2A to 2C includes the insulating layer 204 which is over the substrate 200 and has an island-like groove; the gate electrode layer 202 in contact with a side surface and a bottom surface of the groove; an insulating layer 205 which is provided in contact with the gate electrode layer 202 so as to cover the groove and at least part of the top surface of the insulating layer 204; the insulating layer 206 which is provided in contact with the gate electrode layer 202 not covered with the insulating layer 205 and covers the groove with the gate electrode layer 202 and the insulating layer 205 interposed therebetween; the oxide semiconductor layer 208 which overlaps with the gate electrode layer 202 with the insulating layers 205 and 206 interposed therebetween and fills the groove; the source electrode layer 210*a* and the drain electrode layer 210*b* which are electrically connected to the oxide semiconductor layer 208 and provided over the insulating layer 204 with the insulating layers 205 and 206 interposed therebetween; and the insulating layer 212 provided over the insulating layer 206 so as to cover the source electrode layer 210*a* and the drain electrode layer 210*b*.

The transistor 260 illustrated in FIGS. 2A to 2C is different from the transistor 250 in FIGS. 1A to 1C in the structure of the gate electrode layer 202. In the transistor 250, the insulating layer 204 is formed so as to cover the gate electrode layer 202 over the substrate, and then the groove (opening) reaching the gate electrode layer 202 is formed, whereby the gate electrode layer 202 is formed under the bottom surface of the groove. In the transistor 260, the insulating layer 204 is formed and the groove is formed in the insulating layer 204; then, the gate electrode layer 202 is formed to cover the groove.

Note that in the transistor 260, the insulating layers 205 and 206 between the oxide semiconductor layer 208 and the gate electrode layer 202 serve as gate insulating layers.

In the transistor 260, the gate electrode layer 202 is in contact with the side surface and bottom surface of the groove in the insulating layer 204 and the oxide semiconductor layer 208 is provided so as to fill the groove with the insulating layers 205 and 206 interposed therebetween. As a result, in the channel width direction, the gate electrode layer 202 overlaps with the side surface and bottom surface of the oxide semiconductor layer 208 with the insulating layers 205 and 206 interposed therebetween.

Because the gate electrode layer 202 overlaps with the side surface and bottom surface of the oxide semiconductor layer 208, the electric field of the gate electrode layer 202 can be applied also in the direction of a side surface of a channel formation region. With such a structure, the electric field is applied to the channel formation region in both the vertical and horizontal directions, allowing the threshold voltage of the transistor 260 to be controlled effectively and the S value to be reduced.

When the channel width of the transistor 260 (the length of the groove in the insulating layer 204 in the channel width direction) is too large, it is difficult for the electric field of the gate electrode layer 202 to be applied in the direction of the side surface of the channel formation region, causing difficulty in controlling the threshold voltage. In order that the electric field can be sufficiently applied from the gate electrode layer 202 in the direction of the side surface of the oxide semiconductor layer 208, the film thickness of the oxide semiconductor layer 208 is preferably larger than or equal to the channel width.

In general, a reduced channel width of a transistor might cause a decrease in on-state current. The thickness of an active layer can be increased by a known method so that a channel is formed on a side surface of the active layer to increase the on-state current. In that case, the surface area of a region where the channel is formed increases to cause more carrier scattering at the interface between the channel formation region and a gate insulating layer therefore, a sufficient increase in on-state current cannot be expected.

However, in the transistor 260 of this embodiment, the oxide semiconductor layer 208 where the channel is formed is surrounded by the insulating layers 206 and 212 including an aluminum oxide film containing excess oxygen. Thus, excess oxygen contained in the aluminum oxide film can be supplied to the oxide semiconductor layer 208 and removal of oxygen from the oxide semiconductor layer 208 and entry of impurities such as hydrogen in the oxide semiconductor layer 208 can be inhibited. Since oxygen vacancies and hydrogen produce carriers in the oxide semiconductor layer 208, the aluminum oxide film containing excess oxygen reduces carrier scattering which might occur at the interface with the oxide semiconductor layer 208 where the channel is formed.

Thus, even with a reduced channel width, the on-state current can be sufficiently increased by increasing the thickness of the oxide semiconductor layer 208 to increase the surface area overlapping with the gate electrode layer 202.

Note that part of hydrogen in the oxide semiconductor layer is trapped in oxygen vacancies. As a result, the oxide semiconductor layer has n-type conductivity and the Fermi level (Ef) thereof is closer to the bottom of the conduction band (Ec). The oxide semiconductor layer including a large amount of hydrogen therefore contributes to an improvement in the field-effect mobility of the transistor though the electrical characteristics thereof might vary. On the contrary, the Fermi energy of the intrinsic or substantially intrinsic oxide semiconductor layer 208 is equal to or close to the mid gap (the middle of the energy gap of the oxide semiconductor layer). In that case, the number of carriers decreases in the oxide semiconductor layer 208, leading to a reduced field-effect mobility.

In the transistor 260, however, a gate electric field is applied to the oxide semiconductor layer 208 in both the vertical and horizontal directions. That is, the gate electric field is applied to the whole of the oxide semiconductor layer 208, whereby current flows in the bulk of the oxide semiconductor layer 208. It is thus possible to improve the field-effect mobility of the transistor 260 while variation in the electrical characteristics is reduced by highly purified intrinsic properties.

In the transistor 260 of this embodiment, the oxide semiconductor layer 208 is formed to fill the groove in the insulating layer 204. Accordingly, the thickness of the oxide semiconductor layer 208 can be increased while miniaturization of the transistor is achieved.

The other components of the transistor 260 can be similar to those of the transistor 250.

An example of a method for manufacturing the transistor 260 will be described with reference to FIGS. 3A to 3C and FIGS. 4A to 4C.

Figure 3A:
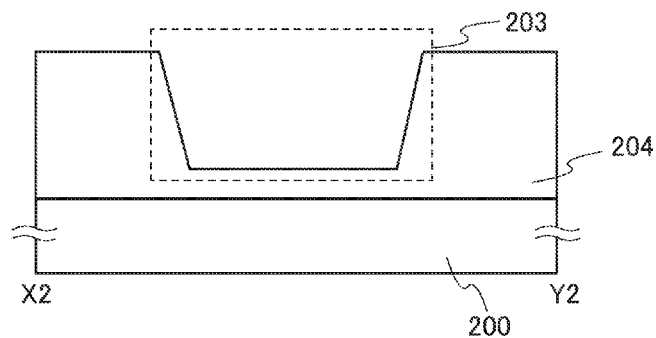
FIGS. 3A to 3C are cross-sectional views illustrating a method for manufacturing the semiconductor device.
Figure 3B:
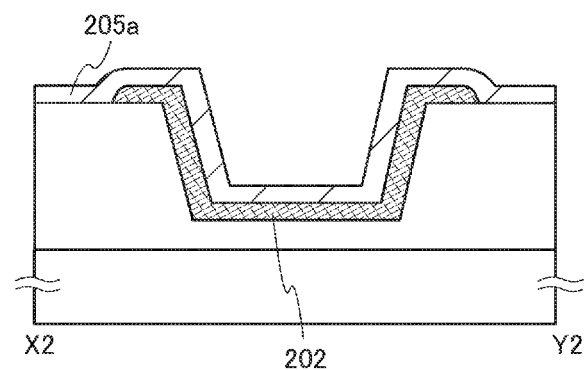

The insulating layer 204 is formed over the substrate 200 having an insulating surface, and the groove (also referred to as a trench) 203 is formed in the insulating layer 204 (see FIG. 3A).

There is no particular limitation on the substrate that can be used as the substrate 200 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 200, or the substrate provided with a semiconductor element can be used as the substrate 200.

The semiconductor device may be manufactured using a flexible substrate as the substrate 200. To manufacture a flexible semiconductor device, the transistor 260 may be directly formed over a flexible substrate; or alternatively, the transistor 260 may be formed over a substrate and then separated from the substrate and transferred to a flexible substrate. Note that in order to separate the transistor 260 from the manufacturing substrate and transfer it to the flexible substrate, a separation layer may be provided between the manufacturing substrate and the transistor 260.

As the insulating layer 204, a silicon oxide film, a silicon oxynitride film, a silicon nitride oxide film, or the like can be formed.

The groove 203 can be formed in the following manner, for example. A resist mask is formed over the insulating layer 204 by a photolithography process, and the insulating layer 204 is etched using the resist mask.

The groove 203 is formed in one or more etching processes. In the case where plural etching processes are performed, a dry etching process and a wet etching process may be performed in combination.

This embodiment shows an example in which the groove 203 is formed by etching the insulating layer 204 while leaving part of it, though one embodiment of the present invention is not limited to this example. For example, an insulating layer with an etching rate different from that of the insulating layer 204 may be provided under the insulating layer 204, so that the groove (here, an opening) is formed in the insulating layer 204 using that insulating layer with a different etching rate as an etching stopper.

Next, a conductive film is formed over the insulating layer 204 so as to cover the groove 203 and then processed to obtain the gate electrode layer 202 (including wirings formed with the same layer). After that, an insulating film 205a is formed over the insulating layer 204 so as to cover the gate electrode layer 202 (see FIG. 3B).

The gate electrode layer 202 can be made using a metal film containing an element selected from molybdenum, titanium, tantalum, tungsten, aluminum, copper, chromium, neodymium, and scandium; a metal nitride film containing any of the above elements as its component (a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the gate electrode layer 202. The gate electrode layer 202 can also be made of a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 202 have a stacked structure of the above conductive material and the above metal material.

The gate electrode layer 202 can have a single-layer structure or a layered structure. As one layer of the gate electrode layer 202 that is in contact with the insulating film 205a, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function of 5 eV (electron volt) or higher, preferably 5.5 eV (electron volt) or higher, and the use of this film as the gate electrode layer enables the threshold voltage of the transistor to shift in the positive direction. Accordingly, a so-called normally-off switching element can be obtained.

The gate electrode layer 202 can be formed by a plasma CVD method, a sputtering method, or the like.

The insulating film 205a can have a single-layer structure or a layered structure using the same material as that of the insulating layer 204. Note that the thickness of the insulating film 205a is preferably larger than or equal to at least the thickness of the gate electrode layer 202.

Then, the insulating film 205a is subjected to etch-back treatment or chemical mechanical polishing (CMP) treatment so that part of the gate electrode layer 202 is exposed. Note that the CMP treatment and the etch-back treatment may be performed in combination. The etch-back treatment or the CMP treatment removes the insulating film 205a over the gate electrode layer 202 that is in contact with the top surface of the insulating layer 204, thereby forming the insulating layer 205 including a region in contact with the top surface of the insulating layer 204 and a region in contact with the gate electrode layer 202 inside the groove.

Figure 3C:
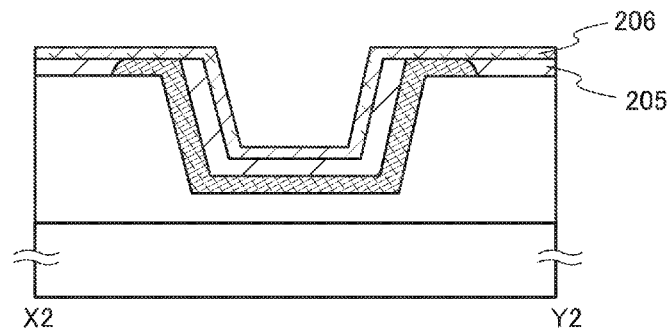

Next, the insulating layer 206 is formed over and in contact with the insulating layer 205 (see FIG. 3C).

The insulating layer 206 includes at least an aluminum oxide film containing excess oxygen. The insulating layer 206 may have a layered structure of an aluminum oxide film and any of a silicon oxide film, a gallium oxide film, an aluminum oxide film, a silicon nitride film, a silicon oxynitride film, an aluminum oxynitride film, and a silicon nitride oxide film. In the case of the layered structure, insulating films other than the aluminum oxide film may also contain excess oxygen.

For example, the insulating layer 206 may have a layered structure in which an aluminum oxide film containing excess oxygen and a silicon oxide film containing excess oxygen are stacked in this order from the side closer to the gate electrode layer 202. In that case, the aluminum oxide film opposite the oxide semiconductor layer with the silicon oxide film therebetween suppresses outward diffusion of excess oxygen contained in the silicon oxide film, and also allows oxygen to be effectively supplied to the oxide semiconductor layer 208 formed later.

The aluminum oxide film included in the insulating layer 206 is preferably formed by a sputtering method using an aluminum oxide target. Alternatively, the aluminum oxide film may be formed by reactive sputtering using an aluminum target. When an aluminum oxide film is formed in an atmosphere containing oxygen, the formed aluminum oxide film can contain excess oxygen. The proportion of oxygen in the deposition gas is preferably higher than or equal to 30 vol %. A rare gas (e.g., argon) may be contained in addition to oxygen.

Alternatively, as the aluminum oxide film included in the insulating layer 206, an aluminum oxide film containing silicon oxide may be formed using an aluminum oxide target containing silicon oxide at a proportion of 0.1% to 30%. Because the oxygen permeability of silicon oxide is higher than that of aluminum oxide, excess oxygen contained in the aluminum oxide film including silicon oxide is easily released. In addition, the use of the aluminum oxide film including silicon oxide for a transistor produces an effect of stress relief. On the contrary, a high proportion of silicon oxide reduces barrier properties against oxygen; therefore, the aluminum oxide target preferably contains silicon oxide at a proportion of 30% or lower, for example, at a proportion of 5% or 10%.

The insulating layer 206 is preferably formed at a high substrate temperature, in which case the hydrogen concentration in the insulating layer 206 can be reduced. The substrate temperature is, for example, higher than or equal to 100° C. and lower than or equal to 500° C., preferably higher than or equal to 150° C. and lower than or equal to 450° C.

Figure 4A:
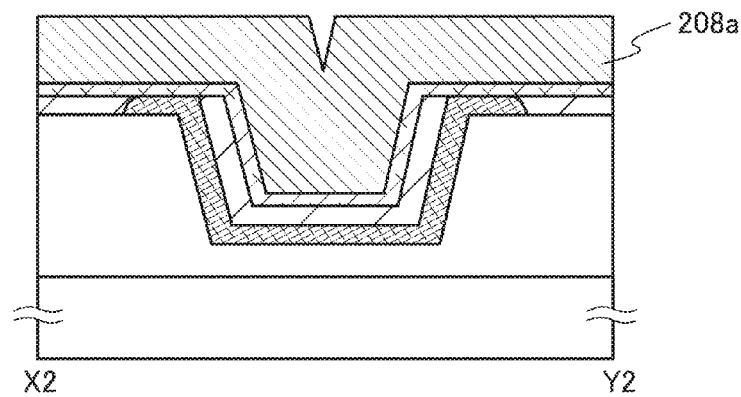
FIGS. 4A to 4C are cross-sectional views illustrating the method for manufacturing the semiconductor device.
Figure 4B:
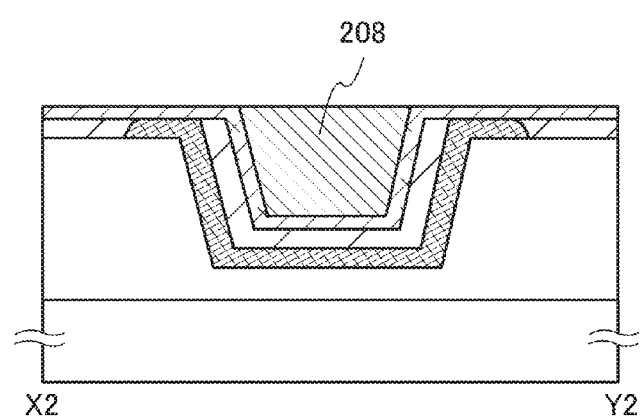

Next, an oxide semiconductor film 208a is formed over the insulating layer 206 so as to fill the groove in the insulating layer 204 (see FIG. 4A).

The oxide semiconductor film 208a may have either a single-layer structure or a layered structure. Furthermore, the oxide semiconductor film 208a may have either an amorphous structure or a crystalline structure.

The oxide semiconductor film 208a can be formed by a sputtering method, a molecular beam epitaxy (MBE) method, a CVD method, a pulse laser deposition method, an atomic layer deposition (ALD) method, or the like as appropriate.

The oxide semiconductor film 208a is preferably formed so as to contain hydrogen as little as possible. In order to reduce the hydrogen concentration, for example, in the case where a sputtering method is used for the deposition, a high-purity rare gas (typically, argon) from which impurities such as hydrogen, water, a hydroxyl group, or a hydride have been removed; oxygen; or a mixed gas of oxygen and the rare gas is used as appropriate as an atmosphere gas supplied to a deposition chamber of a sputtering apparatus.

The oxide semiconductor film 208a is formed in such a manner that a sputtering gas from which hydrogen and moisture are removed is introduced into a deposition chamber while moisture remaining in the deposition chamber is removed, whereby the hydrogen concentration in the deposited oxide semiconductor layer can be reduced. In order to remove the residual moisture in the deposition chamber, an entrapment vacuum pump, for example, a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like, allowing a reduction in the impurity concentration in the oxide semiconductor film 208a formed in the deposition chamber which is evacuated with the cryopump.

In the case where the oxide semiconductor film 208a is formed by a sputtering method, the relative density (the fill rate) of a metal oxide target used for the deposition is greater than or equal to 90% and less than or equal to 100%, preferably greater than or equal to 95% and less than or equal to 99.9%. With the use of the metal oxide target having high relative density, the dense oxide semiconductor film 208a can be formed.

The formation of the oxide semiconductor film 208a while the substrate 200 is kept at high temperature is also effective in reducing the impurity concentration in the oxide semiconductor film 208a. The heating temperature of the substrate 200 may be higher than or equal to 150° C. and lower than or equal to 450° C.; the substrate temperature is preferably higher than or equal to 200° C. and lower than or equal to 350° C. When the substrate is heated at a high temperature in deposition, the oxide semiconductor film 208a having crystallinity can be formed.

An oxide semiconductor used for the oxide semiconductor film 208a contains at least indium (In). In particular, indium and zinc (Zn) are preferably contained. The oxide semiconductor preferably contains, in addition to In and/or Zn, gallium (Ga) serving as a stabilizer that reduces variation in the electrical characteristics of transistors using the oxide semiconductor. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

Examples of the oxide semiconductor include the following: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For example, an In—Ga—Zn-based oxide refers to an oxide containing In, Ga, and Zn as its main components, and there is no limitation on the composition ratio of In, Ga, and Zn. The In—Ga—Zn-based oxide may contain a metal element other than In, Ga, and Zn.

Note that, a transistor including an oxide semiconductor containing indium is not limited to that described above, and a material with an appropriate composition may be used depending on required electrical characteristics (e.g., field-effect mobility and threshold voltage) of the transistor. In order to obtain required electrical characteristics, it is preferable that the carrier density, the impurity concentration, the defect density, the atomic ratio of a metal element to oxygen, the interatomic distance, the density, and the like be set to be appropriate.

Heat treatment is preferably performed after the formation of the oxide semiconductor film 208a. The heat treatment may be performed at a temperature of 250° C. to 650° C., preferably 300° C. to 500° C. in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. The heat treatment here allows impurities such as hydrogen and water to be removed from the oxide semiconductor film 208a. The heat treatment may be performed after the oxide semiconductor film 208a is processed into an island shape.

Then, the oxide semiconductor film 208a is subjected to etch-back treatment or chemical mechanical polishing (CMP) treatment so that part of the insulating layer 206 is exposed. Note that the CMP treatment and the etch-back treatment may be performed in combination. The etch-back treatment or the CMP treatment removes the oxide semiconductor film 208a that is in contact with the top surface of the insulating layer 206, thereby forming the oxide semiconductor layer 208 which is processed into an island shape so as to fill the island-like groove (see FIG. 4B).

Then, a conductive film is formed over the insulating layer 206 and the island-like oxide semiconductor layer 208 and processed to form the source electrode layer 210a and the drain electrode layer 210b (including wirings formed with the same layer). The source electrode layer 210a and the drain electrode layer 210b can be formed using the same material as that of the gate electrode layer 202, and can have a single-layer structure or a layered structure.

Although not illustrated, the source electrode layer 210a and the drain electrode layer 210b may have a step-like end with a plurality of steps. The end can be processed by alternately performing the step of making a resist mask recede by ashing and an etching step plural times. It is preferable that the number of steps be increased as the source electrode layer 210a and the drain electrode layer 210b have a larger thickness. When the source electrode layer 210a and the drain electrode layer 210b have the aforementioned shape including a plurality of steps, coverage with the insulating layer 212 formed over the source electrode layer 210a and the drain electrode layer 210b is improved, so that the transistor can have more favorable electrical characteristics and higher long-term reliability.

When the conductive film is processed into the source electrode layer 210a and the drain electrode layer 210b, part of the oxide semiconductor layer 208 (regions that are not covered with the source electrode layer 210a and the drain electrode layer 210b) might be etched to be thinned by overetching of the conductive film.

Figure 4C:
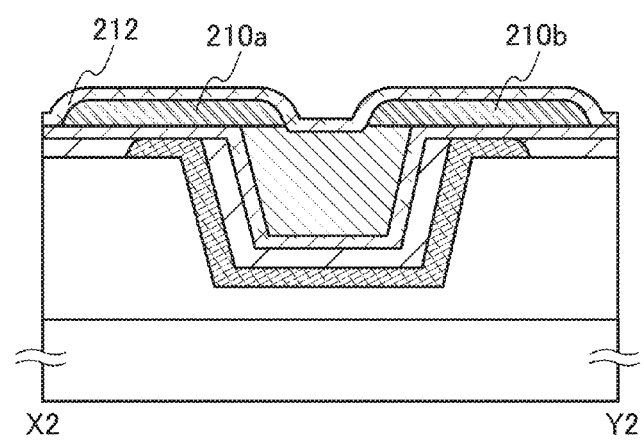

Next, the insulating layer 212 is formed over the source electrode layer 210a and the drain electrode layer 210b (see FIG. 4C). The insulating layer 212 includes at least an aluminum oxide film containing excess oxygen, and can be formed using a structure and a manufacturing method similar to those of the insulating layer 206.

Heat treatment may be performed after the formation of the insulating layer 212. The conditions of the heat treatment may be similar to those of the above heat treatment after the formation of the oxide semiconductor film 208a.

Through the above steps, the transistor 260 of this embodiment can be obtained.

In the semiconductor device of this embodiment, the oxide semiconductor layer is surrounded by the insulating layers including an aluminum oxide film containing excess oxygen. This allows oxygen to be supplied to the oxide semiconductor layer and inhibits the removal of oxygen from the oxide semiconductor layer and the entry of impurities such as hydrogen in the oxide semiconductor layer.

It is thus possible to reduce variation in electrical characteristics such as threshold voltage, which might occur due to oxygen vacancies in the channel formation region. Specifically, for example, stable normally-off state is achieved. Accordingly, a semiconductor device that has favorable electrical characteristics and high long-term reliability can be provided.

The gate electrode layer which overlaps with the oxide semiconductor layer with the gate insulating layer interposed therebetween is preferably provided to overlap with the side surface and bottom surface of the channel formation region in the channel width direction. With such a structure, the gate electrode layer overlaps with the side surface and bottom surface of the oxide semiconductor layer and the electric field is applied to the channel formation region both in the direction of the side surface and in the direction of the bottom surface, allowing the threshold voltage of the transistor to be controlled effectively and the S value to be reduced.

This embodiment can be combined with any of the other embodiments in this specification as appropriate.

(Embodiment 2)

In this embodiment, a structure of the semiconductor device different from that in Embodiment 1 will be described with reference to FIGS. 5A to 5D. For the components similar to those in Embodiment 1, the description of Embodiment 1 can be referred to and is not repeated in some cases.

FIGS. 5A to 5D illustrate an example of a structure of a transistor 280. FIG. 5A is a plan view of the transistor 280, FIG. 5B is a cross-sectional view taken along line V3-W3 in FIG. 5A, and FIG. 5C is a cross-sectional view taken along line X3-Y3 in FIG. 5A. FIG. 5D is a band diagram schematically showing the energy at the bottom of the conduction band of a layered structure included in the transistor 280.

The transistor 280 illustrated in FIGS. 5A to 5C includes, like the transistor 260 in Embodiment 1, the insulating layer 204 which is over the substrate 200 and has an island-like groove; the gate electrode layer 202 in contact with a side surface and a bottom surface of the groove; the insulating layer 205 which is provided in contact with the gate electrode layer 202 so as to cover the groove and at least part of the top surface of the insulating layer 204; the insulating layer 206 which is provided in contact with the gate electrode layer 202 not covered with the insulating layer 205 and covers the groove with the gate electrode layer 202 and the insulating layer 205 interposed therebetween; the oxide semiconductor layer 208 which overlaps with the gate electrode layer 202 with the insulating layers 205 and 206 interposed therebetween and fills the groove; the source electrode layer 210a and the drain electrode layer 210b which are electrically connected to the oxide semiconductor layer 208 and provided over the insulating layer 204 with the insulating layers 205 and 206 interposed therebetween; and the insulating layer 212 provided over the insulating layer 206 so as to cover the source electrode layer 210a and the drain electrode layer 210b.

The transistor 280 in this embodiment includes, in addition to the structure of the aforementioned transistor 260, a first oxide layer 207 which is between the insulating layer 206 and the oxide semiconductor layer 208 and includes as a constituent element at least one of metal elements contained in the oxide semiconductor layer 208, and a second oxide layer 209 which is between the insulating layer 212 and the oxide semiconductor layer 208 and includes as a constituent element at least one of metal elements contained in the oxide semiconductor layer 208.

In the transistor 280, the insulating layer 206 is formed over and in contact with the insulating layer 205 through the manufacturing steps of the transistor 260 shown in Embodiment 1. Then, a first oxide film to be the first oxide layer 207 and the oxide semiconductor film 208a are formed in succession over the insulating layer 206 so as to cover the groove. After that, the first oxide film and the oxide semiconductor film 208a are subjected to etch-back treatment or CMP treatment using the insulating layer 206 as a stopper, whereby the first oxide layer 207 is formed. After the formation of the source electrode layer 210a and the drain electrode layer 210b, a second oxide film is formed over and in contact with the source electrode layer 210a and the drain electrode layer 210b so as to cover the oxide semiconductor layer 208 not covered with the source electrode layer 210a and the drain electrode layer 210b. Then, the second oxide film is processed to form the second oxide layer 209. This process to obtain the second oxide layer 209 can be performed using a resist mask formed by a photolithography process. The insulating layer 212 can be formed over the second oxide layer 209 in a manner similar to that in Embodiment 1.

The oxide semiconductor layer 208 in the transistor 280 includes a layer represented by an In-M-Zn oxide, which contains at least indium, zinc, and M (A is a metal element such as Al, Ga, Ge, Y, Zr, Sn, La, Ce, or Hf). The oxide semiconductor layer 208 preferably contains indium, because the carrier mobility of the transistor increases.

The first oxide layer 207 under the oxide semiconductor layer 208 includes an oxide layer which is represented by an In-M-Zn oxide (M is a metal element such as Al, Ti, Ga, Ge, Y, Zr, Sn, La, Ce, or Hf) and which has a higher proportion of M in atomic ratio than the oxide semiconductor layer 208 has. Specifically, the amount of the element M in the first oxide layer 207 in atomic ratio is 1.5 times or more, preferably twice or more, and more preferably three times or more as much as that in the oxide semiconductor layer 208. The element M is more strongly bonded to oxygen than indium is, and thus have a function of suppressing generation of oxygen vacancies in the oxide layer. That is, oxygen vacancies are less likely to be generated in the first oxide layer 207 than in the oxide semiconductor layer 208.

Like the first oxide layer 207, the second oxide layer 209 over the oxide semiconductor layer 208 includes an oxide layer which is represented by an In-M-Zn oxide (M is a metal element such as Al, Ti, Ga, Ge, Y, Zr, Sn, La, Ce, or Hf) and which has a higher proportion of M in atomic ratio than the oxide semiconductor layer 208 has. Specifically, the amount of the element M in the second oxide layer 209 in atomic ratio is 1.5 times or more, preferably twice or more, and more preferably three times or more as much as that in the oxide semiconductor layer 208.

In other words, when each of the first oxide layer 207, the oxide semiconductor layer 208, and the second oxide layer 209 is an In-M-Zn oxide containing at least indium, zinc, and M (M is a metal element such as Al, Ti, Ga, Ge, Y, Zr, Sn, La, Ce, or Hf), and the first oxide layer 207 has an atomic ratio of In to M and Zn which is $x_1:y_1:z_1$, the oxide semiconductor layer 208 has an atomic ratio of In to M and Zn which is $x_2:y_2:z_2$, and the second oxide layer 209 has an atomic ratio of In to M and Zn which is $x_3:y_3:z_3$, $y_1/x_1$ and $y_3/x_3$ are each preferably larger than $y_2/x_2$. Each of $y_1/x_1$ and $y_3/x_3$ is 1.5 times or more as large as $y_2/x_2$, preferably 2 times or more, and more preferably 3 times or more as large as $y_2/x_2$. At this time, when $y_2$ is greater than or equal to $x_2$ in the oxide semiconductor layer 208, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case of using an In-M-Zn oxide for the first oxide layer 207, when Zn and O are not taken into consideration, the proportion of In and the proportion of M are preferably less than 50 atomic % and greater than or equal to 50 atomic %, respectively, more preferably less than 25 atomic % and greater than or equal to 75 atomic %, respectively. In the case of using an In-M-Zn oxide for the oxide semiconductor layer 208, when Zn and O are not taken into consideration, the proportion of In and the proportion of M are preferably greater than or equal to 25 atomic % and less than 75 atomic %, respectively, more preferably greater than or equal to 34 atomic % and less than 66 atomic %, respectively. In the case of using an In-M-Zn oxide for the second oxide layer 209, when Zn and O are not taken into consideration, the proportion of In and the proportion of M are preferably less than 50 atomic % and greater than or equal to 50 atomic %, respectively, more preferably less than 25 atomic % and greater than or equal to 75 atomic %, respectively.

The first oxide layer 207 and the second oxide layer 209 may include different constituent elements, or include the same constituent elements at the same atomic ratios or different atomic ratios.

For example, an oxide semiconductor containing indium, zinc, and gallium can be used for the first oxide layer 207, the oxide semiconductor layer 208, and the second oxide layer 209.

It is preferable that each of the first oxide layer 207 and the second oxide layer 209 contain one or more kinds of metal elements contained in the oxide semiconductor layer 208, and include an oxide semiconductor whose energy at the bottom of the conduction band is closer to the vacuum level than the energy at the bottom of the conduction band of the oxide semiconductor layer 208 is by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode layer 202 in such a structure, a channel is formed in the oxide semiconductor layer 208, because the oxide semiconductor layer 208 has the lowest energy at the bottom of the conduction band in the layered structure of the first oxide layer 207, the oxide semiconductor layer 208, and the second oxide layer 209, which is interposed between the insulating layer 206 functioning as part of a gate insulating layer and the insulating layer 212 functioning as a protective insulating layer. In other words, the first oxide layer 207 and the second oxide layer 209 prevent the channel of the transistor from being in contact with the insulating layer 206 and the insulating layer 212 which include constituent elements (except oxygen) different from those of the oxide semiconductor layer 208.

FIG. 5D schematically shows a band structure of the layered structure including the insulating layer 206, the first oxide layer 207, the oxide semiconductor layer 208, the second oxide layer 209, and the insulating layer 212. In FIG. 5D, Evac denotes the energy of the vacuum level, and Ec denotes the energy at the bottom of the conduction band.

FIG. 5D shows that the oxide semiconductor layer interposed between the oxide layers forms a well and a channel is formed in the oxide semiconductor layer in the transistor having the layered structure. The energy at the bottom of the conduction band is changed continuously in the first oxide layer 207, the oxide semiconductor layer 208, and the second oxide layer 209; therefore, a U-shaped or round well can be considered to be formed. The channel with such a structure can also be referred to as a buried channel.

As shown in FIG. 5D, the energy at the bottom of the conduction band is continuously changed to be curved in the vicinity of the interface between the oxide semiconductor layer 208 and each of the first oxide layer 207 and the second oxide layer 209. The energy band gap of the oxide layer represented by an In-M-Zn oxide becomes larger as the proportion of the element M increases. Hence, a mixed region (mixed layer) of each layer is formed in the vicinity of the interface between the oxide semiconductor layer 208 and each of the first oxide layer 207 and the second oxide layer 209. The proportion of the element M thus changes gradually in the mixed region, whereby the round well shown in FIG. 5D is probably obtained. In addition, oxygen is easily diffused in the first oxide layer 207, the oxide semiconductor layer 208, and the second oxide layer 209 because these layers have similar compositions. On the contrary, the mixed region is unlikely to be formed between the insulating layer 206 and the first oxide layer 207 and between the second oxide layer 209 and the insulating layer 212 because these layers have different compositions. Therefore, a continuous change is not observed in the energy band diagram.

When the energy at the bottom of the conduction band has a round well in the vicinity of the interface between the oxide semiconductor layer 208 and each of the first oxide layer 207 and the second oxide layer 209, electric field concentration can be reduced in the vicinity of the interface.

FIG. 5D shows an example in which the energy at the bottom of the conduction band of the first oxide layer 207 is closer to the vacuum level than the energy at the bottom of the conduction band of the second oxide layer 209 is. However, the first oxide layer 207 and the second oxide layer 209 may have the same energy at the bottom of the conduction band, or the energy at the bottom of the conduction band of the second oxide layer 209 may be closer to the vacuum level than the energy at the bottom of the conduction band of the first oxide layer 207 is.

Since each of the first oxide layer 207 and the second oxide layer 209 contains one or more kinds of metal elements contained in the oxide semiconductor layer 208, the layered structure including these layers can also be regarded as an oxide stack of layers containing the same main components. The oxide stack of layers containing the same main components is formed not simply by stacking layers but to have a continuous junction (here, in particular, a U-shaped (round) well structure in which energy at the bottom of the conduction band is changed continuously between the layers). This is because when impurities which form a defect state such as a trap center or a recombination center are mixed at each interface, the continuity of the energy band is lost, and thus carriers are trapped or disappear by recombination at the interface.

To form a continuous junction, it is necessary to stack the layers in succession without exposure to the air using a multi-chamber deposition apparatus (sputtering apparatus) provided with load lock chambers. Each chamber of the sputtering apparatus is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evacuation in a chamber but also high purity of a sputtering gas is necessary to obtain a highly purified intrinsic oxide semiconductor. An oxygen gas or an argon gas used as the sputtering gas is preferably highly purified to have a dew point of $-40°$ C. or lower, preferably $-80°$ C. or lower, and more preferably $-100°$ C. or lower, whereby entry of moisture or the like into the oxide semiconductor can be prevented as much as possible.

The first oxide layer 207 and the second oxide layer 209 which are provided over and under the oxide semiconductor layer 208 each serve as a barrier layer and can prevent trap levels formed at an interface between the oxide stack and each of the insulating layers (the insulating layers 206 and 212) in contact with the oxide stack from adversely affecting the oxide semiconductor layer 208 that serves as a main carrier path for the transistor.

Specifically, the first oxide layer 207 and the second oxide layer 209 in which oxygen vacancies are less likely to be generated than in the oxide semiconductor layer 208 are provided over and under and in contact with the oxide semiconductor layer 208, allowing a reduction in the amount of oxygen vacancies in the oxide semiconductor layer 208. This inhibits the formation of trap levels at the interface with the oxide semiconductor layer 208 due to oxygen vacancies. For example, in the oxide semiconductor layer 208, the absorption coefficient due to the localized levels, which is measured by a constant photocurrent method (CPM) is set lower than $1 \times 10^{-3}$/cm, preferably lower than $1 \times 10^{-4}$/cm.

In addition, when the back channel side of the oxide semiconductor layer 208 is in contact with an insulating layer including a different constituent element (e.g., the insulating layer 212 including an aluminum oxide film), an interface state is sometimes formed at the interface between the two layers and the interface state forms a channel. In that case, a second transistor having a different threshold voltage is formed in some cases, which might vary the apparent threshold voltage of the transistor. However, in the transistor 280, the second oxide layer 209 contains one or more kinds of metal elements contained in the oxide semiconductor layer 208; thus, an interface state is less likely to be formed at the interface with the back channel side of the oxide semiconductor layer 208. The second oxide layer 209 thus makes it possible to reduce variation in the electrical characteristics of the transistor, such as a threshold voltage.

When a channel is formed at the interface between the insulating layer 206 functioning as the gate insulating layer and the oxide semiconductor layer 208, interface scattering occurs at the interface and the field-effect mobility of the transistor decreases. However, in the transistor 280, the first oxide layer 207 contains one or more kinds of metal elements contained in the oxide semiconductor layer 208; thus, scattering of carriers is less likely to occur at the interface with the front channel side of the oxide semiconductor layer 208, and the field-effect mobility of the transistor can be increased.

Moreover, the first oxide layer 207 and the second oxide layer 209 each also serve as a barrier layer which suppresses formation of an impurity state due to entry of the constituent elements of the insulating layers 206 and 212 into the oxide semiconductor layer 208.

For example, the concentration of silicon contained in the oxide semiconductor layer 208 is lower than or equal to $3 \times 10^{18}$/cm$^3$, preferably lower than or equal to $3 \times 10^{17}$/cm$^3$. The concentration of carbon contained in the oxide semiconductor layer 208 is lower than or equal to $3 \times 10^{18}$/cm$^3$, preferably lower than or equal to $3 \times 10^{17}$/cm$^3$.

Note that the impurity concentration in the oxide semiconductor layer can be measured by secondary ion mass spectrometry (SIMS).

The thickness of each of the first oxide layer 207 and the second oxide layer 209 is determined so as to prevent constituent elements of the insulating layers 206 and 212, which serve as impurities in the oxide semiconductor, from entering the oxide semiconductor layer 208. An increase in the thickness of the oxide semiconductor layer 208 results in an increase in the on-state current of the transistor 280. Therefore, the thickness of the oxide semiconductor layer 208 is preferably at least larger than the thickness of each of the first oxide layer 207 and the second oxide layer 209.

Since the first oxide layer 207 is provided between the gate electrode layer and the oxide semiconductor layer 208 serving as a channel, the thickness of the first oxide layer 207 is preferably as small as possible for an increase in the on-state current of the transistor. Specifically, the thickness of the first oxide layer 207 is, for example, greater than or equal to 0.3 nm and less than 10 nm, preferably greater than or equal to 0.3 nm and less than or equal to 5 nm.

If hydrogen or moisture is contained as an impurity in the oxide semiconductor layer, it serves as a donor and forms an n-type region. Therefore, in order to achieve a well-shaped structure, it is useful to provide the insulating layer 206 under the first oxide layer 207 and the insulating layer 212 over the second oxide layer 209, because the insulating layers 206 and 212 each include an aluminum oxide film that prevents entry of hydrogen or moisture from the outside.

When the energy difference between the bottom of the conduction band of the first oxide layer 207 or the second oxide layer 209 and the bottom of the conduction band of the oxide semiconductor layer 208 is small, an electron in the oxide semiconductor layer 208 might reach the trap level by passing over the energy difference. When the electron is trapped in the trap level, a negative fixed charge is generated and the threshold voltage of the transistor shifts in the positive direction.

Thus, the energy difference between the bottom of the conduction band of the first oxide layer 207 or the second oxide layer 209 and the bottom of the conduction band of the oxide semiconductor layer 208 is preferably greater than or equal to 0.1 eV, more preferably greater than or equal to 0.15 eV, in which case variation in the threshold voltage of the transistor is reduced and stable electrical characteristics can be obtained.

In the above transistor 280 of this embodiment, the oxide layers including at least one of metal elements contained in the oxide semiconductor layer 208 are provided between the oxide semiconductor layer 208 and each of the gate insulating layer and the protective insulating layer which overlap with the oxide semiconductor layer 208. This suppresses the formation of trap states at the interfaces between the oxide semiconductor layer 208 and each of the insulating layers overlapping with the oxide semiconductor layer 208. As a result, deterioration of the electrical characteristics of the transistor 280 can be minimized.

Also in this embodiment, the gate electrode layer 202 overlapping with the oxide semiconductor layer 208 with the gate insulating layer interposed therebetween is provided to overlap with the side surface and bottom surface of the channel formation region in the oxide semiconductor layer 208. Accordingly, the electric field is applied to the channel formation region in both the vertical and horizontal directions, allowing the threshold voltage of the transistor 280 to be controlled more effectively and the S value to be reduced.

Furthermore, in the transistor 280 of this embodiment, the oxide semiconductor layer 208 is surrounded by the insulating layers 206 and 212 each including an aluminum oxide film containing excess oxygen. This allows sufficient oxygen to be supplied to the oxide semiconductor layer 208 surrounded by the insulating layers 206 and 212 including an aluminum oxide film, and inhibits the removal of oxygen from the oxide semiconductor layer 208 and the entry of impurities such as hydrogen in the oxide semiconductor layer 208.

It is more effective that the oxide semiconductor layer 208 be surrounded by the insulating layers including an aluminum oxide film containing excess oxygen while the oxide semiconductor layer 208 be in contact with the oxide layers including at least one of metal elements contained in the oxide semiconductor layer 208. In that case, carrier scattering which might occur at the interface of the oxide semiconductor layer 208 including the channel can be further reduced.

This embodiment can be combined with any of the other embodiments in this specification as appropriate.

(Embodiment 3)

In this embodiment, structures of the semiconductor device different from those in Embodiments 1 and 2, and an embodiment of a method for manufacturing the semiconductor device will be described with reference to FIGS. 6A to 6C, FIGS. 7A to 7C, FIGS. 8A to 8D, and FIGS. 9A to 9C.

Figure 6A:
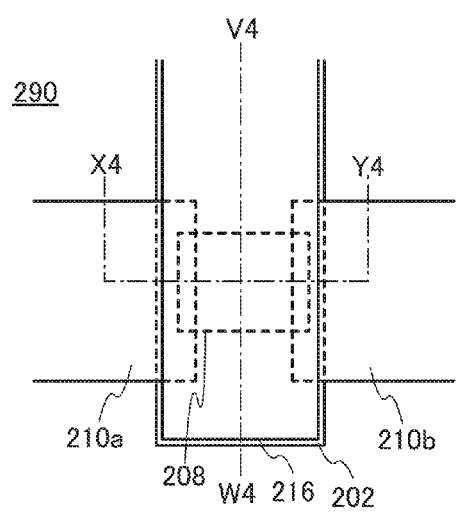
FIGS. 6A to 6C are a plan view and cross-sectional views illustrating one embodiment of a semiconductor device.
Figure 6B:
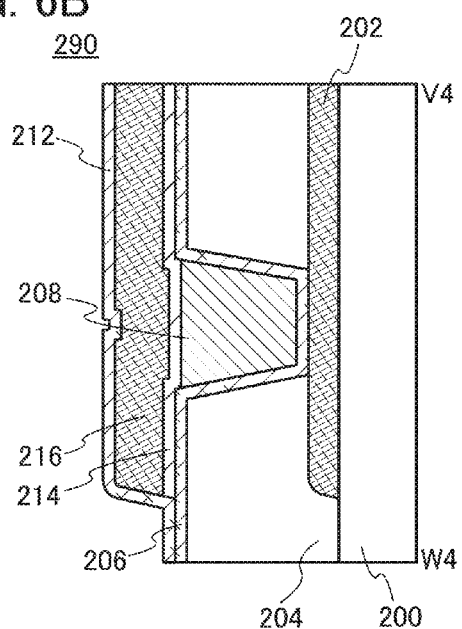
Figure 6C:
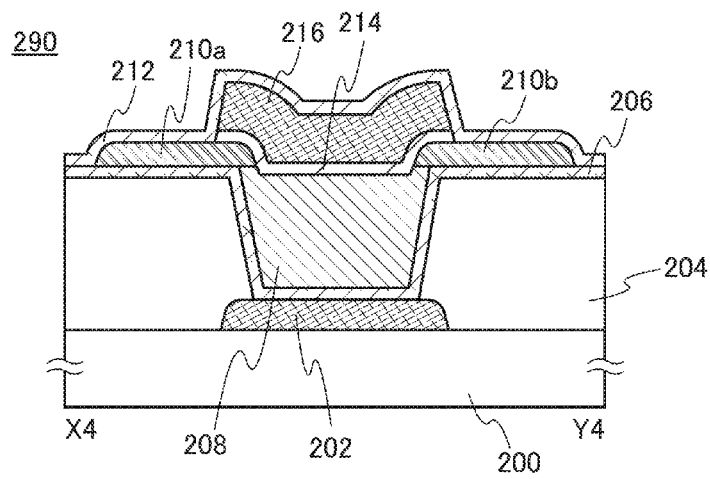

FIGS. 6A to 6C illustrate an example of a structure of a transistor 290. FIG. 6A is a plan view of the transistor 290, FIG. 6B is a cross-sectional view taken along line V4-W4 in FIG. 6A, and FIG. 6C is a cross-sectional view taken along line X4-Y4 in FIG. 6A. Note that in FIG. 6A, some components of the transistor 290 (e.g., the insulating layer 212) are not illustrated to avoid complexity. The structure of the transistor 290 is similar to that of the transistor 250, except for the components described below.

The transistor 290 illustrated in FIGS. 6A to 6C includes a first gate electrode layer 202 over the substrate 200; the insulating layer 204 having an island-like groove; the insulating layer 206 which is provided in contact with the gate electrode layer 202 so as to cover the groove and at least part of a top surface of the insulating layer 204; the oxide semiconductor layer 208 which overlaps with the first gate electrode layer 202 with the insulating layer 206 interposed therebetween and fills the groove in the insulating layer 204; the source electrode layer 210a and the drain electrode layer 210b which are electrically connected to the oxide semiconductor layer 208 and provided over the insulating layer 204 with the insulating layer 206 interposed therebetween; an insulating layer 214 which is over the source electrode layer 210a and the drain electrode layer 210b and overlaps with the oxide semiconductor layer 208; a second gate electrode layer 216 which overlaps with the oxide semiconductor layer 208 with the insulating layer 214 interposed therebetween; and the insulating layer 212 provided over the insulating layer 206 so as to cover the source electrode layer 210a and the drain electrode layer 210b.

In the transistor 290, the insulating layer 206 between the first gate electrode layer 202 and the oxide semiconductor layer 208 functions as a first gate insulating layer; the insulating layer 214 between the second gate electrode layer 216 and the oxide semiconductor layer 208 functions as a second gate insulating layer; and the insulating layer 212 provided over the oxide semiconductor layer 208 so as to cover the source electrode layer 210a, the drain electrode layer 210b, and the second gate electrode layer 216 functions as a protective insulating layer.

In the transistor 290, an insulating layer including an aluminum oxide film containing excess oxygen is used as the insulating layer 206, which is under the oxide semiconductor layer 208 and covers the side surface and bottom surface of the oxide semiconductor layer 208, and the insulating layer 212 serving as a protective insulating layer.

In addition, as illustrated in the cross-sectional views of FIGS. 6B and 6C, in both a channel length direction (the direction in which carriers flow) and a channel width direction, the insulating layer 206 serving as the first gate insulating layer and the insulating layer 212 serving as the protective insulating layer are in contact with each other in a region where the oxide semiconductor layer 208, the source electrode layer 210a, the drain electrode layer 210b, and the second gate electrode layer 216 do not exist. In other words, the oxide semiconductor layer 208 in the transistor 290 is surrounded by the insulating layers including an aluminum oxide film.

In the transistor 290, an electric field is applied to the oxide semiconductor layer 208 vertically from the first gate electrode layer 202 under the oxide semiconductor layer 208 and the second gate electrode layer 216 over the oxide semiconductor layer 208; as a result, the threshold voltage of the transistor 290 can be controlled effectively. The first gate electrode layer 202 and the second gate electrode layer 216 may have, but are not limited to, the same potential.

Figure 7A:
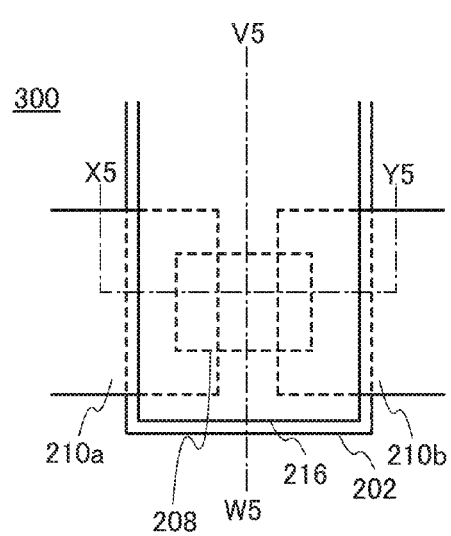
FIGS. 7A to 7C are a plan view and cross-sectional views illustrating one embodiment of a semiconductor device.
Figure 7B:
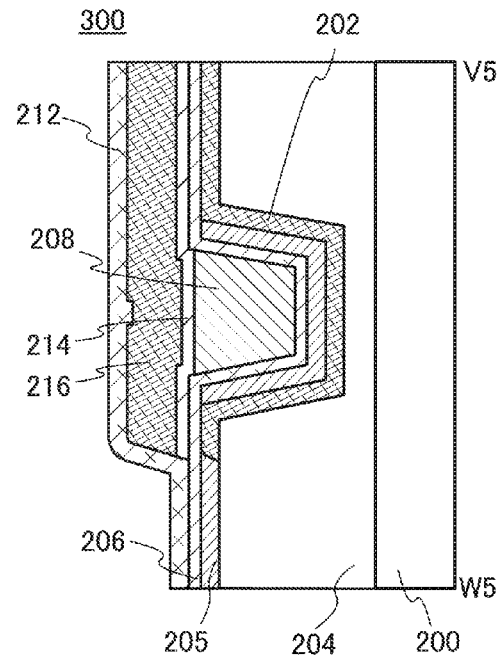
Figure 7C:
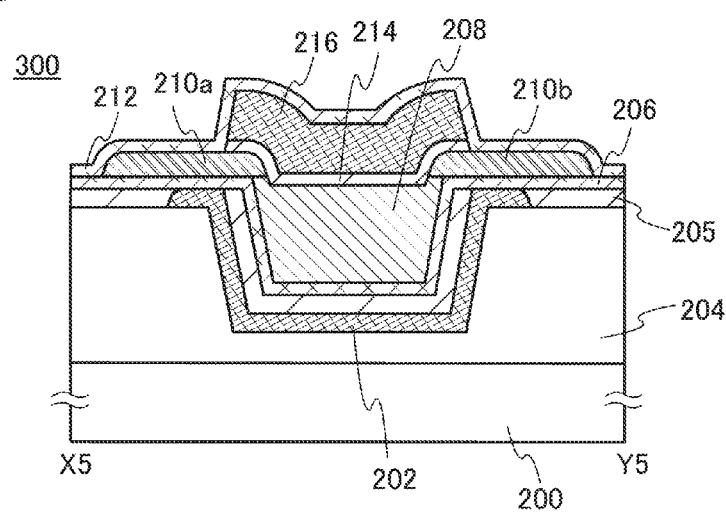

FIGS. 7A to 7C illustrate an example of a structure of a transistor 300 as another example of the transistor of this embodiment. FIG. 7A is a plan view of the transistor 300. FIG. 713 is a cross-sectional view taken along line V5-W5 in FIG. 7A, and FIG. 7C is a cross-sectional view taken along line X5-Y5 in FIG. 7A.

The transistor 300 illustrated in FIGS. 7A to 7C includes the insulating layer 204 which is over the substrate 200 and has an island-like groove; the first gate electrode layer 202 in contact with a side surface and a bottom surface of the groove; the insulating layer 205 which is provided in contact with the first gate electrode layer 202 so as to cover the groove and at least part of the top surface of the insulating layer 204; the insulating layer 206 which is provided in contact with the first gate electrode layer 202 not covered with the insulating layer 205 and covers the groove with the first gate electrode layer 202 and the insulating layer 205 interposed therebetween; the oxide semiconductor layer 208 which overlaps with the first gate electrode layer 202 with the insulating layers 205 and 206 interposed therebetween and fills the groove; the source electrode layer 210a and the drain electrode layer 210b which are electrically connected to the oxide semiconductor layer 208 and provided over the insulating layer 204 with the insulating layers 205 and 206 interposed therebetween; the insulating layer 214 which is over the source electrode layer 210a and the drain electrode layer 210b and overlaps with the oxide semiconductor layer 208; the second gate electrode layer 216 which overlaps with the oxide semiconductor layer 208 with the insulating layer 214 interposed therebetween; and the insulating layer 212 provided over the insulating layer 206 so as to cover the source electrode layer 210a, the drain electrode layer 210b, and the second gate electrode layer 216.

In the transistor 300, the insulating layers 206 and 205 between the first gate electrode layer 202 and the oxide semiconductor layer 208 function as a first gate insulating layer; the insulating layer 214 between the second gate electrode layer 216 and the oxide semiconductor layer 208 functions as a second gate insulating layer; and the insulating layer 212 provided over the oxide semiconductor layer 208 so as to cover the source electrode layer 210a, the drain electrode layer 210b, and the second gate electrode layer 216 functions as a protective insulating layer.

The transistor 300 illustrated in FIGS. 7A to 7C is different from the transistor 290 in FIGS. 6A to 6C in the structure of the first gate electrode layer 202. In the transistor 290, the insulating layer 204 is formed so as to cover the first gate electrode layer 202 over the substrate, and then the groove (opening) reaching the first gate electrode layer 202 is formed, whereby the first gate electrode layer 202 is formed under the bottom surface of the groove. In the transistor 300, the insulating layer 204 is formed and the groove is formed in the insulating layer 204; then, the first gate electrode layer 202 is formed to cover the groove.

In the transistor 300, the first gate electrode layer 202 is in contact with the side surface and bottom surface of the groove in the insulating layer 204 and the oxide semiconductor layer 208 is provided so as to fill the groove with the insulating layers 205 and 206 interposed therebetween. As a result, in the channel width direction, the first gate electrode layer 202 overlaps with the side surface and bottom surface of the oxide semiconductor layer 208 with the insulating layers 205 and 206 interposed therebetween.

Because the first gate electrode layer 202 overlaps with the side surface and bottom surface of the oxide semiconductor layer 208, the electric field of the first gate electrode layer 202 can be applied also in the direction of a side surface of a channel formation region. With such a structure, the electric field is applied to the channel formation region in both the vertical and horizontal directions, allowing the threshold voltage of the transistor 300 to be controlled more effectively and the S value to be reduced.

When the channel width of the transistor 300 (the length of the groove in the insulating layer 204 in the channel width direction) is too large, it is difficult for the electric field of the first gate electrode layer 202 to be applied in the direction of the side surface of the channel formation region, causing difficulty in controlling the threshold voltage. In order that the electric field can be sufficiently applied from the first gate electrode layer 202 in the direction of the side surface of the oxide semiconductor layer 208, the film thickness of the oxide semiconductor layer 208 is preferably larger than or equal to the channel width.

The other components of the transistor 300 can be similar to those of the transistor 290.

An example of a method for manufacturing the transistor 300 will be described with reference to FIGS. 8A to 8D and FIGS. 9A to 9C. Note that the transistor 300 can be manufactured in a manner similar to that in Embodiment 1, except for the points described below.

Figure 8A:
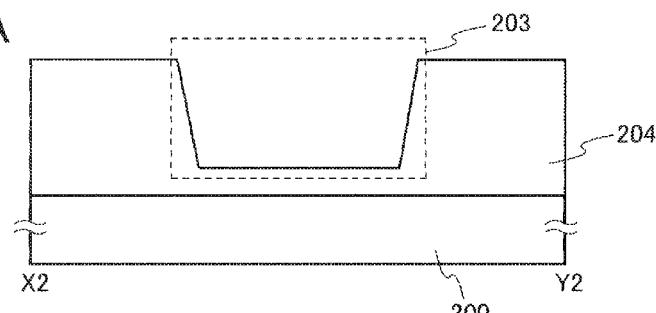
FIGS. 8A to 8D are cross-sectional views illustrating a method for manufacturing the semiconductor device.
Figure 8B:
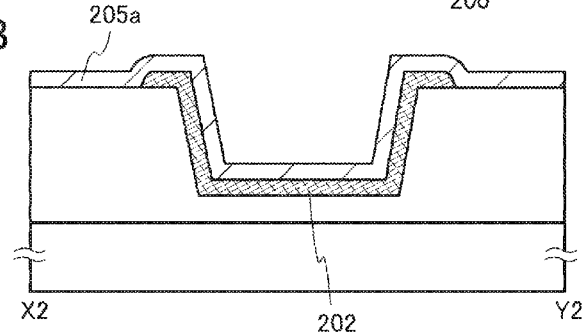

The insulating layer 204 is formed over the substrate 200 having an insulating surface, and the groove (also referred to as a trench) 204 is formed in the insulating layer 204 (see FIG. 8A). The substrate 200 and the insulating layer 204 can be formed using materials similar to those in Embodiment 1. The groove 203 can be formed in steps similar to those in Embodiment 1.

Next, a conductive film is formed over the insulating layer 204 so as to cover the groove 203 and then processed to obtain the first gate electrode layer 202 (including wirings formed with the same layer). After that, an insulating film 205a is formed over the insulating layer 204 so as to cover the first gate electrode layer 202 (see FIG. 8B).

The first gate electrode layer 202 can have a single-layer structure or a layered structure using the same material as that of the gate electrode layer 202 in Embodiment 1. The insulating film 205a can have a single-layer structure or a layered structure using the same material as that of the insulating layer 204. Note that the thickness of the insulating film 205a is preferably larger than or equal to at least the thickness of the first gate electrode layer 202.

Then, the insulating film 205a is subjected to etch-back treatment or chemical mechanical polishing (CMP) treatment so that part of the first gate electrode layer 202 is exposed. Note that the CMP treatment and the etch-back treatment may be performed in combination. The etch-back treatment or the CMP treatment removes the insulating film 205a over the first gate electrode layer 202 that is in contact with the top surface of the insulating layer 204, thereby forming the insulating layer 205 including a region in contact with the top surface of the insulating layer 204 and a region in contact with the first gate electrode layer 202 inside the groove.

Figure 8C:
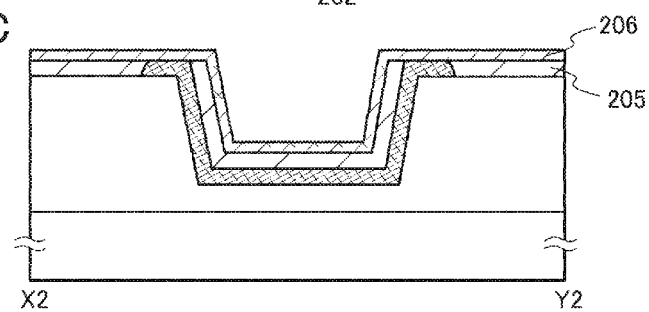

Next, the insulating layer 206 is formed over and in contact with the insulating layer 205 (see FIG. 8C). The insulating layer 206 can have a single-layer structure or a layered structure using the same material as that in Embodiment 1.

Figure 8D:
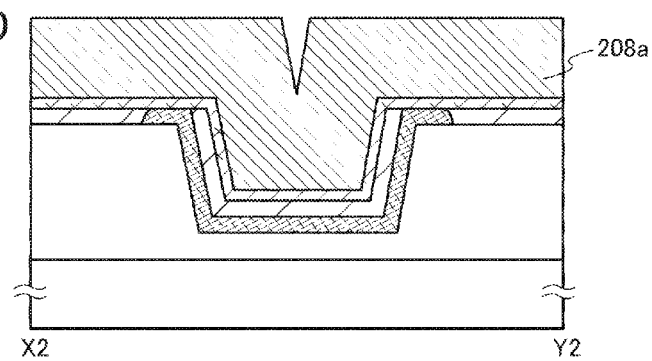

Next, an oxide semiconductor film 208a is formed over the insulating layer 206 so as to fill the groove in the insulating layer 204 (see FIG. 8D). Note that the oxide semiconductor film 208a can be formed using the same material as that in Embodiment 1.

The oxide semiconductor film 208a may have either a single-layer structure or a layered structure. Furthermore, the oxide semiconductor film 208a may have either an amorphous structure or a crystalline structure.

Heat treatment is preferably performed after the formation of the oxide semiconductor film 208a. The heat treatment may be performed at a temperature of 250° C. to 650° C., preferably 300° C. to 500° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. The heat treatment here allows impurities such as hydrogen and water to be removed from the oxide semiconductor film 208a. The heat treatment may be performed after the oxide semiconductor film 208a is processed into an island shape.

Then, the oxide semiconductor film 208a is subjected to etch-back treatment or chemical mechanical polishing (CMP) treatment so that part of the insulating layer 206 is exposed. Note that the CMP treatment and the etch-back treatment may be performed in combination. The etch-back treatment or the CMP treatment removes the oxide semiconductor film 208a that is in contact with the top surface of the insulating layer 206, thereby forming the oxide semiconductor layer 208 which is processed into an island shape so as to fill the island-like groove (see FIG. 9A).

Then, a conductive film is formed over the insulating layer 206 and the island-like oxide semiconductor layer 208 and processed to form the source electrode layer 210a and the drain electrode layer 210b (including wirings formed with the same layer). After that, the insulating film 214a is formed over the insulating layer 206 so as to cover the source electrode layer 210a and the drain electrode layer 210b (see FIG. 9B).

The source electrode layer 210a and the drain electrode layer 210b can be formed using the same material as that of the gate electrode layer 202, and can have a single-layer structure or a layered structure.

The insulating film 214a can be formed using the same material and manufacturing method as those of the insulating film 205a.

Although not illustrated, the source electrode layer 210a and the drain electrode layer 210b may have a step-like end with a plurality of steps. The end can be processed by alternately performing the step of making a resist mask recede by ashing and an etching step plural times. It is preferable that the number of steps be increased as the source electrode layer 210a and the drain electrode layer 210b have a larger thickness. When the source electrode layer 210a and the drain electrode layer 210b have the aforementioned shape including a plurality of steps, coverage with the insulating layer 212 formed over the source electrode layer 210a and the drain electrode layer 210b is improved, so that the transistor can have more favorable electrical characteristics and higher long-term reliability.

When the conductive film is processed into the source electrode layer 210a and the drain electrode layer 210b, part of the oxide semiconductor layer 208 (regions that are not covered with the source electrode layer 210a and the drain electrode layer 210b) might be etched to be thinned by overetching of the conductive film.

Then, a conductive film is formed over the insulating film 214a and processed to form the second gate electrode layer 216 (including wirings formed with the same layer). After that, the insulating film 214a is processed using the second gate electrode layer 216 as a mask, whereby the insulating layer 214 is formed. The insulating layer 214 is preferably processed in a self-aligned manner using the second gate electrode layer 216 as a mask because there is no increase in the number of masks.

Figure 9A:
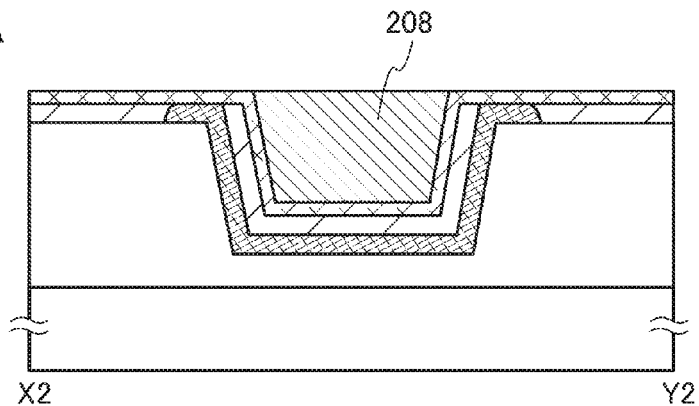
FIGS. 9A to 9C are cross-sectional views illustrating the method for manufacturing the semiconductor device.
Figure 9B:
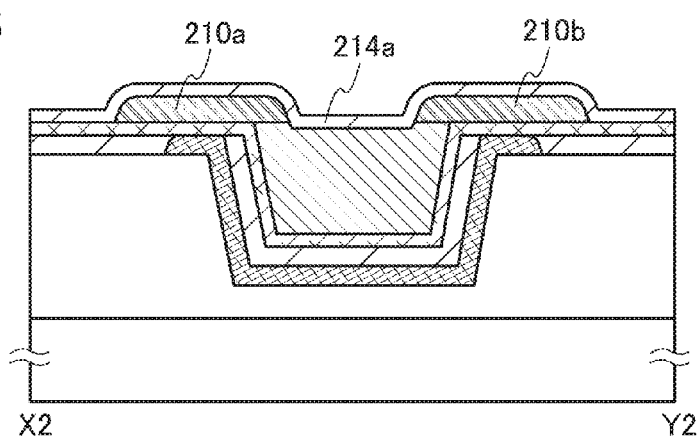
Figure 9C:
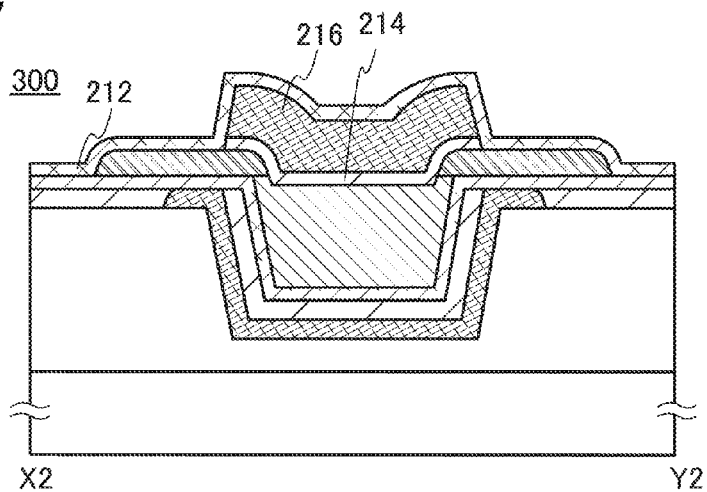

After that, the insulating layer 212 is formed over the insulating layer 206 so as to cover the source electrode layer 210a, the drain electrode layer 210b, and the second gate electrode layer 216 (see FIG. 9C). The insulating layer 212 includes at least an aluminum oxide film containing excess oxygen, and can be formed using a structure and a manufacturing method similar to those of the insulating layer 206.

Heat treatment may be performed after the formation of the insulating layer 212. The conditions of the heat treatment may be similar to those of the above heat treatment after the formation of the oxide semiconductor film 208a.

Through the above steps, the transistor 300 of this embodiment can be obtained.

In the semiconductor device of this embodiment, the oxide semiconductor layer is surrounded by the insulating layers including an aluminum oxide film containing excess oxygen. This allows oxygen to be supplied to the oxide semiconductor layer and inhibits the removal of oxygen from the oxide semiconductor layer and the entry of impurities such as hydrogen in the oxide semiconductor layer.

It is thus possible to reduce variation in electrical characteristics such as threshold voltage, which might occur due to oxygen vacancies in the channel formation region. Specifically, for example, stable normally-off state is achieved. Accordingly, a semiconductor device that has favorable electrical characteristics and high long-term reliability can be provided.

In the semiconductor device of this embodiment, an electric field is applied to the oxide semiconductor layer vertically from the first gate electrode layer under the oxide semiconductor layer and the second gate electrode layer over the oxide semiconductor layer, allowing the threshold voltage of the transistor to be controlled effectively.

The gate electrode layer with which the oxide semiconductor layer overlaps with the gate insulating layer interposed therebetween is preferably provided to overlap with the side surface and bottom surface of the channel formation region in the channel width direction. With such a structure, the gate electrode layer overlaps with the side surface and bottom surface of the oxide semiconductor layer and the electric field is applied to the channel formation region both in the direction of the side surface and in the direction of the bottom surface, allowing the threshold voltage of the transistor to be controlled more effectively and the S value to be reduced.

This embodiment can be combined with any of the other embodiments in this specification as appropriate.

(Embodiment 4)

In this embodiment, a structure of the semiconductor device different from that in Embodiment 3 will be described with reference to FIGS. 10A to 10D and FIGS. 11A to 11C. For the components similar to those in Embodiments 2 and 3, the description of Embodiments 2 and 3 can be referred to and is not repeated in some cases.

FIGS. 10A to 10D illustrate an example of a structure of a transistor 310. FIG. 10A is a plan view of the transistor 310, FIG. 10B is a cross-sectional view taken along line V6-W6 in FIG. 10A, and FIG. 10C is a cross-sectional view taken along line X6-Y6 in FIG. 10A. FIG. 10D is a band diagram schematically showing the energy at the bottom of the conduction band of a layered structure included in the transistor 310.

The transistor 310 illustrated in FIGS. 10A to 10D includes, like the transistor 300 in Embodiment 3, the insulating layer 204 which is over the substrate 200 and has an island-like groove; the first gate electrode layer 202 in contact with a side surface and a bottom surface of the groove; the insulating layer 205 which is provided in contact with the first gate electrode layer 202 so as to cover the groove and at least part of the top surface of the insulating layer 204; the insulating layer 206 which is provided in contact with the first gate electrode layer 202 not covered with the insulating layer 205 and covers the groove with the first gate electrode layer 202 and the insulating layer 205 interposed therebetween; the oxide semiconductor layer 208 which overlaps with the first gate electrode layer 202 with the insulating layers 205 and 206 interposed therebetween and fills the groove; the source electrode layer 210a and the drain electrode layer 210b which are electrically connected to the oxide semiconductor layer 208 and provided over the insulating layer 204 with the insulating layers 205 and 206 interposed therebetween; the insulating layer 214 which is over the source electrode layer 210a and the drain electrode layer 210b and overlaps with the oxide semiconductor layer 208; the second gate electrode layer 216 which overlaps with the oxide semiconductor layer 208 with the insulating layer 214 interposed therebetween; and the insulating layer 212 provided over the insulating layer 206 so as to cover the source electrode layer 210a, the drain electrode layer 210b, and the second gate electrode layer 216.

The transistor 310 in this embodiment includes, in addition to the structure of the aforementioned transistor 300, the first oxide layer 207 which is between the insulating layer 206 and the oxide semiconductor layer 208 and includes as a constituent element at least one of metal elements contained in the oxide semiconductor layer 208, and a second oxide layer 209 which is between the insulating layer 214 and the oxide semiconductor layer 208 and includes as a constituent element at least one of metal elements contained in the oxide semiconductor layer 208.

In the transistor 310, the insulating layer 206 is formed over and in contact with the insulating layer 205 through the manufacturing steps of the transistor 300 shown in Embodiment 3. Then, a first oxide film to be the first oxide layer 207 and the oxide semiconductor film 208a are formed in succession over the insulating layer 206 so as to cover the groove. After that, the first oxide film and the oxide semiconductor film 208a are subjected to etch-back treatment or CMP treatment using the insulating layer 206 as a stopper, whereby the first oxide layer 207 is formed. After the formation of the source electrode layer 210a and the drain electrode layer 210b, a second oxide film and the insulating film 214a are formed in succession over and in contact with the source electrode layer 210a and the drain electrode layer 210b so as to cover the oxide semiconductor layer 208 not covered with the source electrode layer 210a and the drain electrode layer 210b. Then, the second oxide film and the insulating film 214a are processed using the second gate electrode layer 216 as a mask, thereby forming the second oxide layer 209 and the insulating layer 214. This process to obtain the second oxide layer 209 can be performed using a resist mask formed by a photolithography process. The insulating layer 212 can be formed over the second gate electrode layer 216 in a manner similar to that in Embodiment 3.

In the above process, the first oxide film and the oxide semiconductor film 208a, or the second oxide film and the insulating film 214a are preferably formed in succession without exposure to the air, in which case impurities such as hydrogen or moisture can be prevented from being adsorbed on the interface of each layer.

The first oxide layer 207, the oxide semiconductor layer 208, and the second oxide layer 209 can be formed using the same materials and process as those in Embodiment 2.

It is preferable that each of the first oxide layer 207 and the second oxide layer 209 contain one or more kinds of metal elements contained in the oxide semiconductor layer 208, and include an oxide semiconductor whose energy at the bottom of the conduction band is closer to the vacuum level than the energy at the bottom of the conduction band of the oxide semiconductor layer 208 is by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the first gate electrode layer 202 and/or the second gate electrode layer 216 in such a structure, a channel is formed in the oxide semiconductor layer 208, because the oxide semiconductor layer 208 has the lowest energy at the bottom of the conduction band in the layered structure of the first oxide layer 207, the oxide semiconductor layer 208, and the second oxide layer 209, which is interposed between the insulating layer 206 functioning as part of a first gate insulating layer and the insulating layer 214 functioning as a second gate electrode layer. In other words, the first oxide layer 207 and the second oxide layer 209 prevent the channel of the transistor from being in contact with the insulating layer 206 and the insulating layer 212 which include constituent elements (except oxygen) different from those of the oxide semiconductor layer 208.

FIG. 10D schematically shows a band structure of the layered structure including the insulating layer 206, the first oxide layer 207, the oxide semiconductor layer 208, the second oxide layer 209, and the insulating layer 214. In FIG. 10D, Evac denotes the energy of the vacuum level, and Ec denotes the energy at the bottom of the conduction band.

When the energy at the bottom of the conduction band has a round well in the vicinity of the interface between the oxide semiconductor layer 208 and each of the first oxide layer 207 and the second oxide layer 209, electric field concentration can be reduced in the vicinity of the interface.

FIG. 10D shows an example in which the energy at the bottom of the conduction band of the first oxide layer 207 is closer to the vacuum level than the energy at the bottom of the conduction band of the second oxide layer 209 is. However, the first oxide layer 207 and the second oxide layer 209 may have the same energy at the bottom of the conduction band, or the energy at the bottom of the conduction band of the second oxide layer 209 may be closer to the vacuum level than the energy at the bottom of the conduction band of the first oxide layer 207 is.

When the back channel side of the oxide semiconductor layer 208 is in contact with the insulating layer 214 including a different constituent element (e.g., the insulating layer including an aluminum oxide film), an interface state is sometimes formed at the interface between the two layers and the interface state forms a channel. In that case, a second transistor having a different threshold voltage is formed in some cases, which might vary the apparent threshold voltage of the transistor. However, in the transistor 310, the second oxide layer 209 contains one or more kinds of metal elements contained in the oxide semiconductor layer 208; thus, an interface state is less likely to be formed at the interface with the back channel side of the oxide semiconductor layer 208. The second oxide layer 209 thus makes it possible to reduce variation in the electrical characteristics of the transistor, such as a threshold voltage.

In the transistor 310 of this embodiment, the oxide layers including at least one of metal elements contained in the oxide semiconductor layer 208 are provided between the oxide semiconductor layer 208 and each of the gate insulating layer and the protective insulating layer which overlap with the oxide semiconductor layer 208. This suppresses the formation of trap states at the interfaces between the oxide semiconductor layer 208 and each of the insulating layers overlapping with the oxide semiconductor layer 208. As a result, deterioration of the electrical characteristics of the transistor 310 can be minimized.

In the transistor 310, an electric field is applied to the oxide semiconductor layer 208 vertically from the first gate electrode layer 202 under the oxide semiconductor layer 208 and the second gate electrode layer 216 over the oxide semiconductor layer 208; as a result, the threshold voltage of the transistor 310 can be controlled effectively.

Also in this embodiment, the first gate electrode layer 202 overlapping with the oxide semiconductor layer 208 with the gate insulating layer interposed therebetween is provided to overlap with the side surface and bottom surface of the channel formation region in the oxide semiconductor layer 208. Accordingly, the electric field is applied to the channel formation region in both the vertical and horizontal directions, allowing the threshold voltage of the transistor 310 to be controlled more effectively and the S value to be reduced.

Figure 11A:
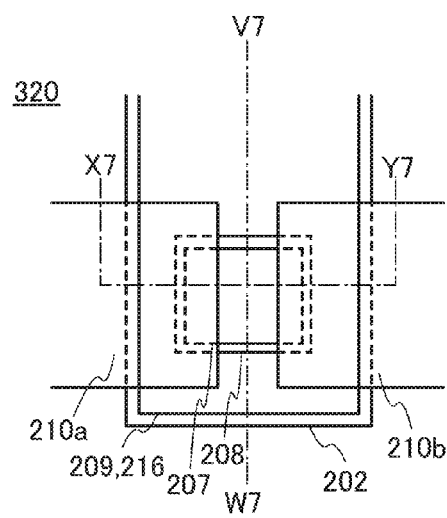
FIGS. 11A to 11C are a plan view and cross-sectional views illustrating one embodiment of a semiconductor device.
Figure 11B:
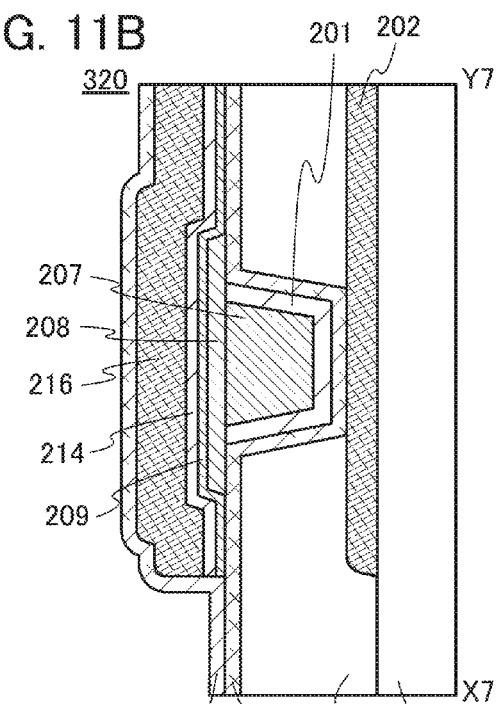
Figure 11C:
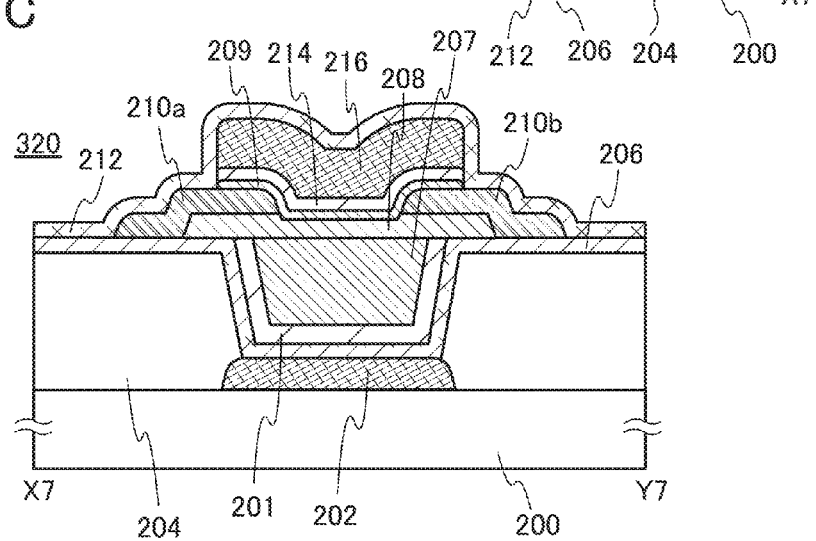

FIGS. 11A to 11C illustrate an example of a structure of a transistor 320, which is an modification example of the transistor 310. FIG. 11A is a plan view of the transistor 320, FIG. 11B is a cross-sectional view taken along line V7-W7 in FIG. 11A, and FIG. 11C is a cross-sectional view taken along line X7-Y7 in FIG. 11A.

The transistor 320 illustrated in FIGS. 11A to 11C includes the first gate electrode layer 202 over the substrate 200; the insulating layer 204 having an island-like groove; the insulating layer 206 which is provided in contact with the first gate electrode layer 202 so as to cover the groove and at least part of a top surface of the insulating layer 204; an insulating layer 201 which covers the groove in the insulating layer 204 with the insulating layer 206 interposed therebetween; the first oxide layer 207 which overlaps with the first gate electrode layer 202 with the insulating layers 206 and 201 interposed therebetween and fills the groove in the insulating layer 204; the island-like oxide semiconductor layer 208 in contact with top surfaces of the insulating layer 206, the insulating layer 201, and the first oxide layer 207, the source electrode layer 210a and the drain electrode layer 210b which are electrically connected to the oxide semiconductor layer 208; the second oxide layer 209 which is over the source electrode layer 210a and the drain electrode layer 210b and in contact with the oxide semiconductor layer 208; the insulating layer 214 over the second oxide layer 209; the second gate electrode layer 216 which overlaps with the oxide semiconductor layer 208 with the insulating layer 214 interposed therebetween; and the insulating layer 212 provided over the insulating layer 206 so as to cover the source electrode layer 210a, the drain electrode layer 210b, and the second gate electrode layer 216.

A method for manufacturing the transistor 320 will be described below.

The gate electrode layer 202 is formed over the substrate and the insulating layer 204 is formed to cover the gate electrode layer 202. The groove (opening) is formed in the insulating layer 204 using the gate electrode layer 202 as an etching stopper, and then, the insulating layer 206 is formed over the insulating layer 204 so as to cover the groove. After that, an insulating film to be the insulating layer 201 and a first oxide film to be the first oxide layer 207 are formed over the insulating layer 206 and planarized by CMP treatment or the like using the insulating layer 206 as an etching stopper. As a result, the first oxide layer 207 is formed to fill the groove with the insulating layers 206 and 201 interposed therebetween.

Then, an oxide semiconductor film is formed over the insulating layers 206 and 201 and the first oxide layer 207, and processed into an island shape to obtain the oxide semiconductor layer 208. After the formation of the oxide semiconductor layer 208, the transistor 320 can be completed in a manner similar to that of the aforementioned transistor 310.

The insulating layer 201 included in the transistor 320, which is in contact with the oxide semiconductor layer 208, preferably contains excess oxygen so that oxygen can be supplied to the oxide semiconductor layer 208. It is also preferable that the insulating layer 201 have a lower hydrogen concentration. Specifically, the concentration of hydrogen in the insulating layer 201 of the transistor 320 is preferably lower than $5\times10^{19}$ atoms/cm$^3$, more preferably lower than $5\times10^{18}$ atoms/cm$^3$.

For example, a silicon oxide film containing excess oxygen or a silicon oxynitride film containing excess oxygen is preferably used for the insulating layer 201 in the transistor 320.

In the transistor 320, a bottom surface and a side surface of the insulating layer 201 are surrounded by the insulating layer 206 including an aluminum oxide film which forms a barrier against oxygen and hydrogen. Accordingly, excess oxygen contained in the insulating layer 201 can be supplied to the oxide semiconductor layer 208 effectively.

Also in the transistor 320, a surface over which the oxide semiconductor layer 208 is formed is planarized by CMP treatment or the like. When a crystalline oxide semiconductor layer is formed as the oxide semiconductor layer 208 over a planarized surface, the crystallinity can be improved.

With the first oxide layer 207 provided to fill the groove, the physical distance between the oxide semiconductor layer 208 and a first gate insulating layer (the insulating layers 206 and 201) can increased in a channel formation region. It is thus possible to further reduce the interface states formed at an interface with the oxide semiconductor layer 208 in the channel formation region.

As mentioned above, in the transistor 310 of this embodiment, the oxide semiconductor layer 208 is surrounded by the insulating layers 206 and 212 each including an aluminum oxide film containing excess oxygen. This allows sufficient oxygen to be supplied to the oxide semiconductor layer 208 surrounded by the insulating layers 206 and 212 including an aluminum oxide film, and inhibits the removal of oxygen from the oxide semiconductor layer 208 and the entry of impurities such as hydrogen in the oxide semiconductor layer 208.

It is more effective that the oxide semiconductor layer 208 be surrounded by the insulating layers including an aluminum oxide film containing excess oxygen while the oxide semiconductor layer 208 be in contact with the oxide layers including at least one of metal elements contained in the oxide semiconductor layer 208. In that case, carrier scattering which might occur at the interface of the oxide semiconductor layer 208 including the channel can be further reduced.

This embodiment can be combined with any of the other embodiments in this specification as appropriate.

(Embodiment 5)

Described in this embodiment is an example of an oxide semiconductor layer that can be applied to the transistors of Embodiments 1 to 4.

An oxide semiconductor layer is classified roughly into a non-single-crystal oxide semiconductor layer and a single crystal oxide semiconductor layer. The non-single-crystal oxide semiconductor layer includes a c-axis aligned crystalline oxide semiconductor (CAAC-OS) film, a polycrystalline oxide semiconductor layer, a microcrystalline oxide semiconductor layer, an amorphous oxide semiconductor layer, and the like.

First, a CAAC-OS film is described.

The CAAC-OS film is one of oxide semiconductor layers including a plurality of c-axis aligned crystal parts In a transmission electron microscope (TEM) image of the CAAC-OS film, it is difficult to clearly observe a boundary between crystal parts, that is, a grain boundary. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to the normal vector of a formation surface or a top surface of the CAAC-OS film. Thus, for example, in the case where a shape of the CAAC-OS film is changed by etching or the like, the c-axis might not be necessarily parallel to the normal vector of a formation surface or a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor layer having low impurity concentration. The impurity is an element other than the main components of the oxide semiconductor layer, such as hydrogen, carbon, silicon, or a transition metal element. In particular, an element (e.g., silicon) that has higher bonding strength to oxygen than a metal element included in the oxide semiconductor layer disturbs the atomic arrangement of the oxide semiconductor layer by depriving the oxide semiconductor layer of oxygen and causes a decrease in crystallinity. In addition, a heavy metal such as iron or nickel, argon, carbon dioxide, or the like has a large atomic radius (or molecular radius), and thus disturbs the atomic arrangement of the oxide semiconductor layer and causes a decrease in crystallinity when it is contained in the oxide semiconductor layer. Note that the impurity contained in the oxide semiconductor layer might serve as a carrier trap or a source of carriers.

The CAAC-OS film is an oxide semiconductor layer having a low density of defect states. For example, oxygen vacancies in the oxide semiconductor layer serve as carrier traps or serve as sources of carriers when hydrogen is captured therein.

An oxide semiconductor layer having a low impurity concentration and a low density of defect states (having few oxygen vacancies), in other words, a highly purified intrinsic or substantially highly purified intrinsic oxide semiconductor layer has few sources of carriers, and thus can have a low carrier density. Thus, a transistor using the oxide semiconductor layer rarely has negative threshold voltage (is rarely normally on). A highly purified intrinsic or substantially highly purified intrinsic oxide semiconductor layer has few carrier traps. Accordingly, the transistor using the oxide semiconductor layer has little variation in electrical characteristics and high reliability. Note that charges trapped by the carrier traps in the oxide semiconductor layer take a long time to be released and may behave like fixed charges. Thus, the transistor using the oxide semiconductor layer with a high impurity concentration and a high density of defect states has unstable electrical characteristics in some cases.

A transistor using the CAAC-OS film has little variation in electrical characteristics due to irradiation with visible light or ultraviolet light.

Next, a microcrystalline oxide semiconductor layer will be described.

In an image obtained with a TEM, crystal parts cannot be easily and clearly found in the microcrystalline oxide semiconductor layer. In most cases, the size of a crystal part included in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) film. In an image of the nc-OS film obtained with a TEM, for example, a boundary between crystal parts is not easily and clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor layer depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor layer having more regularity than the amorphous oxide semiconductor layer, the nc-OS film has a lower density of defect states than the amorphous oxide semiconductor layer. However, there is no regularity of crystal orientation between different crystal parts in the nc-OS film; hence, the nc-OS film has a higher density of defect states than the CAAC-OS film.

Note that an oxide semiconductor layer may be a stacked film including two or more layers of an amorphous oxide semiconductor layer, a microcrystalline oxide semiconductor layer, and a CAAC-OS film, for example.

An example of a method for forming a CAAC-OS film will be described below.

For example, the CAAC-OS film is formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a substrate while maintaining their crystal state, whereby the CAAC-OS film can be formed.

The flat-plate-like sputtered particle or the pellet-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle or the pellet-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C. By increasing the substrate temperature during the deposition, when the flat-plate-like sputtered particles or the pellet-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited. When the temperature for deposition is too high, zinc contained in a target might be sublimed; therefore, the substrate temperature is preferably higher than or equal to 200° C. and lower than or equal to 500° C. more preferably higher than or equal to 200° C. and lower than or equal to 350° C.

By reducing the amount of impurities entering the CAAC-OS film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness greater than or equal to 1 nm and less than 10 nm. The first oxide semiconductor film is formed by a sputtering method. Specifically, the substrate temperature is higher than or equal to 100° C. and lower than or equal to 500° C., preferably higher than or equal to 150° C. and lower than or equal to 450° C., and the proportion of oxygen in a deposition gas is higher than or equal to 30 vol %, preferably 100 vol %.

Then, the first oxide semiconductor film is subjected to heat treatment to be a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film in a shorter time.

The first oxide semiconductor film with a thickness greater than or equal to 1 nm and less than 10 nm can be easily crystallized by heat treatment as compared to the case where the first oxide semiconductor film has a thickness greater than or equal to 10 nm.

Next, a second oxide semiconductor film having the same composition as the first oxide semiconductor film is formed to a thickness greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film in a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film in a shorter time.

In the above manner, a CAAC-OS film with a total thickness greater than or equal to 10 nm can be obtained. The CAAC-OS film can be favorably used as the oxide semiconductor layer in the oxide stack.

Described next is a method for forming an oxide film in the case where a formation surface has a low temperature because, for example, the substrate is not heated is described (for example, the temperature is lower than 130° C., lower than 100° C., lower than 70° C. or at room temperatures (20° C. to 25° C.)).

In the case where the formation surface has a low temperature, sputtered particles fall irregularly to the formation surface. For example, migration does not occur; therefore, the sputtered particles are randomly deposited on the deposition surface including a region where other sputtered particles have been deposited. That is, an oxide film obtained by the deposition might have a non-uniform thickness and a disordered crystal alignment. The oxide film obtained in the above manner maintains the crystallinity of the sputtered particles to a certain degree and thus has a crystal part (nanocrystal).

For example, in the case where the pressure at the deposition is high, the frequency with which the flying sputtered particle collides with another particle (e.g., an atom, a molecule, an ion, or a radical) of argon or the like is increased. When the flying sputtered particle collides with another particle (resputtered), the crystal structure of the sputtered particle might be broken. For example, when the sputtered particle collides with another particle, the plate-like shape of the sputtered particle cannot be kept, and the sputtered particle might be broken into parts (e.g., atomized). At this time, when atoms obtained from the sputtered particle are deposited on the formation surface, an amorphous oxide semiconductor film might be formed.

In the case where not a sputtering method using a target including polycrystalline oxide but a deposition method using liquid or a method for depositing a film by vaporizing a solid such as a target is used, the atoms separately fly to be deposited over the formation surface; therefore, an amorphous oxide film might be formed. For example, by a laser ablation method, atoms, molecules, ions, radials, clusters, or the like released from the target fly to be deposited over the formation surface; therefore, an amorphous oxide film might be formed.

In the case where an oxide semiconductor layer is interposed between oxide layers in a transistor of one embodiment of the present invention, the first oxide layer, the oxide semiconductor layer, and the second oxide layer may each have any of the above crystal states. Note that it is preferable to use a CAAC-OS film as the oxide semiconductor layer serving as a channel.

The structures, the methods, and the like described in this embodiment can be combined as appropriate with any of the structures, the methods, and the like described in the other embodiments.

(Embodiment 6)

Described in this embodiment is a modification example of the transistor shown in Embodiment 1 or 2.

In the case where a plurality of transistors are disposed over a substrate, the integration density of the transistors can be increased by providing a groove not for each transistor but for a plurality of transistors.

Figure 12A:
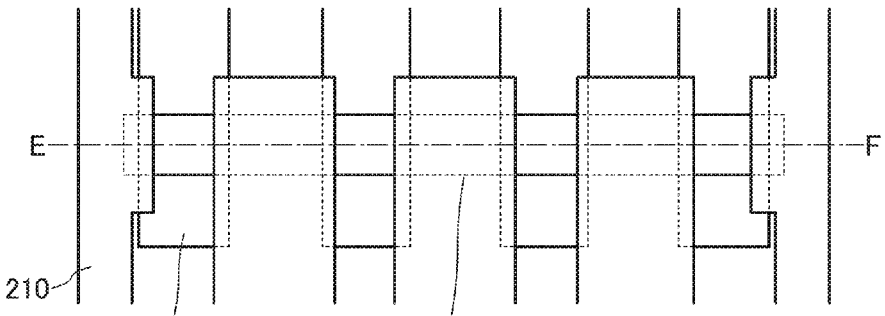
FIG. 12A, FIG. 12B, and FIGS. 12C and 12D are a plan view, a cross-sectional view, and circuit diagrams illustrating an example of a semiconductor device.
Figure 12B:
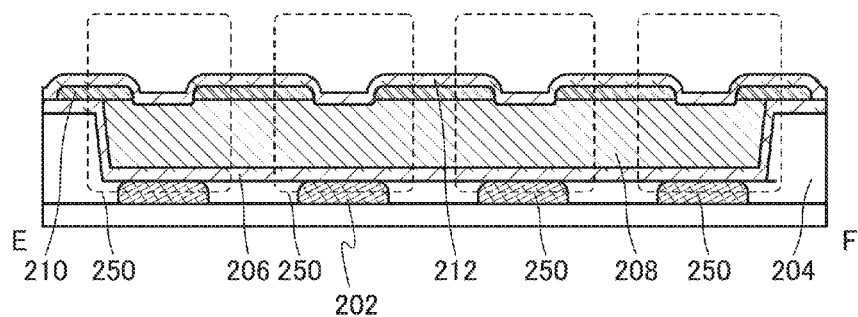

As an example, FIGS. 12A to 12D show the case where four transistors 250 connected in series are provided in an upper portion of a groove formed in the insulating layer 204. FIG. 12A is a schematic top view and FIG. 12B is a schematic cross-sectional view taken along line E-F in FIG. 12A.

As illustrated in FIG. 12B, the four transistors 250 are formed in the upper portion of the groove in the insulating layer 204. The two adjacent transistors 250 share an electrode 210 and thus are connected in series. On the other hand, the gate electrode layer 202 is provided independently for each of the transistors 250.

The insulating layer 206 and the insulating layer 212 are provided to surround the four transistors 250 and in contact with each other outside the electrodes 210 on both ends of the groove.

Figure 12C:
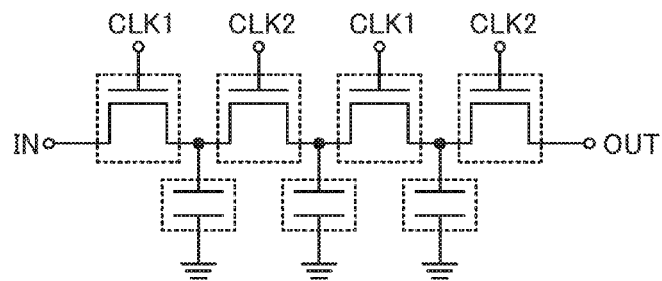

Such transistors 250 connected in series can be applied to, for example, a circuit configuration illustrated in FIG. 12C. The circuit illustrated in FIG. 12C includes four transistors and three capacitors. A source or a drain of one of the two adjacent transistors is electrically connected to a source or a drain of the other transistor to form a node, and one electrode of the capacitor is electrically connected to the node.

The capacitor includes, for example, an electrode formed using the same layer as the gate electrode layer 202 of the transistor 250, and an electrode formed using the same layer as the electrode 210.

The circuit illustrated in FIG. 12C can serve as, for example, a shift register when potentials are applied in the following manner.

A common potential is applied to the other electrode of each of the three capacitors. In the four transistors, a clock signal (CLK1) is applied to gates of the first and third transistors from the left, and a clock signal (CLK2) is applied to gates of the second and fourth transistors from the left. One of the source and the drain of the first transistor is an input terminal to which an input potential (IN) is applied, and one of the source and the drain of the fourth transistor is an output terminal from which an output potential (OUT) is output. CLK1 and CLK2 have potentials with which transistors are alternately turned on (e.g., high-level potential), whereby data of a potential applied to the input terminal can be shifted from the left to the right.

Figure 12D:
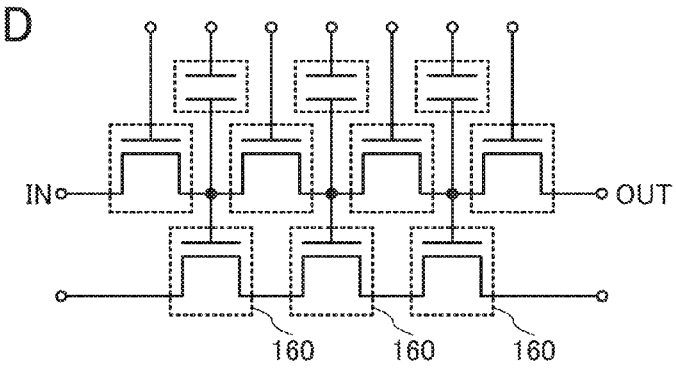

FIG. 12D illustrates a configuration in which a plurality of reading transistors 160 connected in series are added to the circuit illustrated in FIG. 12C. Each of the transistors 160 is electrically connected to a node to which the one electrode of the capacitor is connected. A reading potential is applied to the other electrode of each of the capacitors. With such a structure, the circuit illustrated in FIG. 12D can serve as a NAND memory device that can read data of a potential held in the node connected to the one electrode of the capacitor at any time. Here, the transistor 160 may include an oxide semiconductor similarly to the transistor 250, or may include another semiconductor as described as an example in the following embodiment.

In this embodiment, the transistor 250 shown in Embodiment 1 is used as an example; however, one embodiment of the present invention is not limited to this example and the other transistors shown in the above embodiments may be used as appropriate.

This embodiment can be combined with any of the other embodiments in this specification as appropriate.

(Embodiment 7)

Described in this embodiment is a modification example of the transistor shown in Embodiment 3 or 4.

Figure 13A:
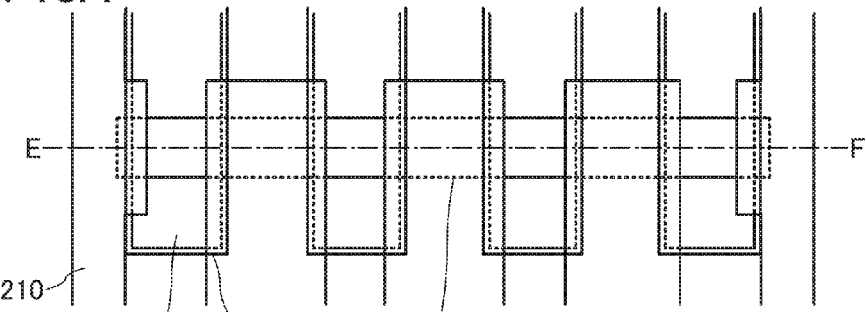
FIG. 13A, FIG. 13B, and FIGS. 13C and 13D are a plan view, a cross-sectional view, and circuit diagrams illustrating an example of a semiconductor device.
Figure 13B:
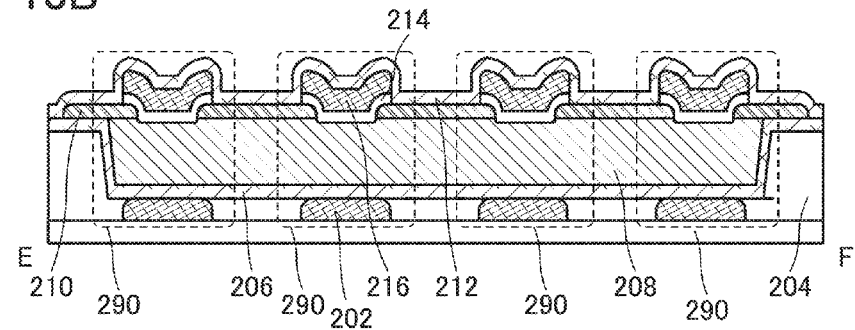

FIGS. 13A to 13D show the case where four transistors 290 connected in series are provided in an upper portion of a groove formed in the insulating layer 204. FIG. 13A is a top view and FIG. 13B is a cross-sectional view taken along line E-F in FIG. 13A. The structure of FIGS. 13A to 13D is similar to that in Embodiment 6, except for the components described below.

As illustrated in FIG. 13B, the four transistors 290 are formed in the upper portion of the groove in the insulating layer 204. The two adjacent transistors 290 share the electrode 210 and thus are connected in series. On the other hand, the first gate electrode layer 202 and the second gate electrode layer 216 are provided independently for each of the transistors 290.

Figure 13C:
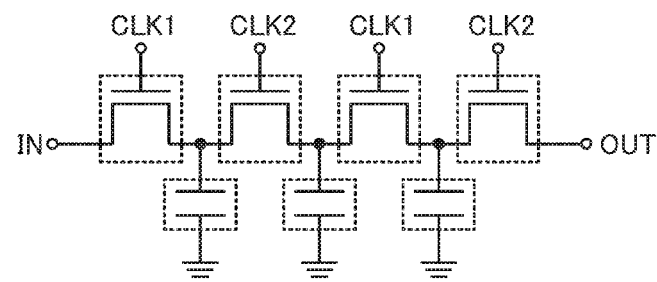

Such transistors 290 connected in series can be applied to, for example, a circuit configuration illustrated in FIG. 13C. The circuit illustrated in FIG. 13C includes four transistors and three capacitors. A source or a drain of one of the two adjacent transistors is electrically connected to a source or a drain of the other transistor to form a node, and one electrode of the capacitor is electrically connected to the node.

The capacitor includes, for example, electrodes formed using the same layer as the first gate electrode layer 202 or the second gate electrode layer 216 of the transistor 290, or the same layer as the electrode 210.

The circuit illustrated in FIG. 13C can serve as, for example, a shift register when potentials are applied in the manner shown in Embodiment 6.

Figure 13D:
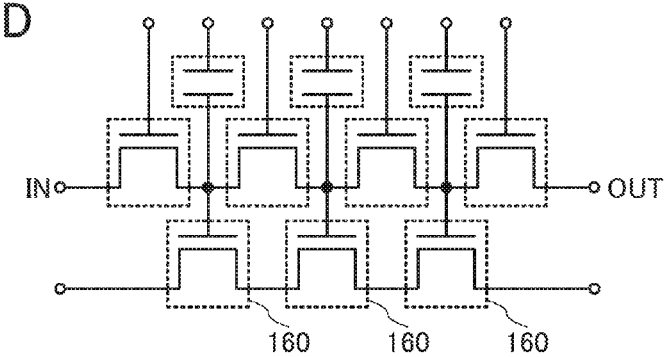

FIG. 13D illustrates a configuration in which the reading transistors 160 connected in series are added to the circuit illustrated in FIG. 13C. Each of the transistors 160 is electrically connected to a node to which the one electrode of the capacitor is connected. A reading potential is applied to the other electrode of each of the capacitors. With such a structure, the circuit illustrated in FIG. 13D can serve as a NAND memory device that can read data of a potential held in the node connected to the one electrode of the capacitor at any time. Here, the transistor 160 may include an oxide semiconductor similarly to the transistor 290, or may include another semiconductor as described as an example in the following embodiment.

Figure 14A:
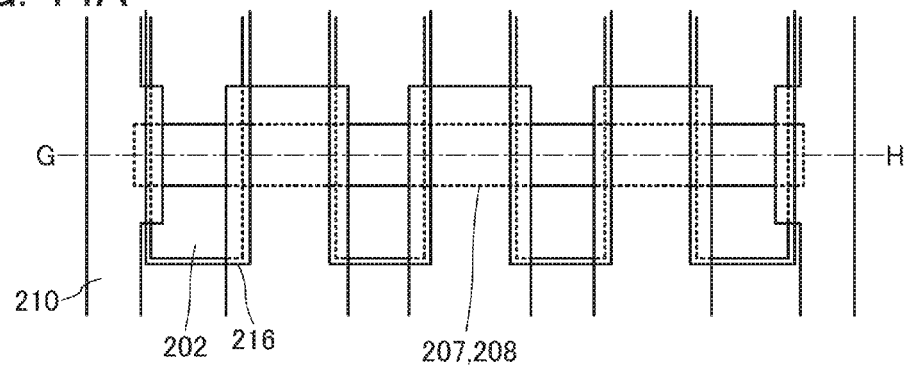
FIGS. 14A and 14B are a plan view and a cross-sectional view illustrating an example of a semiconductor device.
Figure 14B:
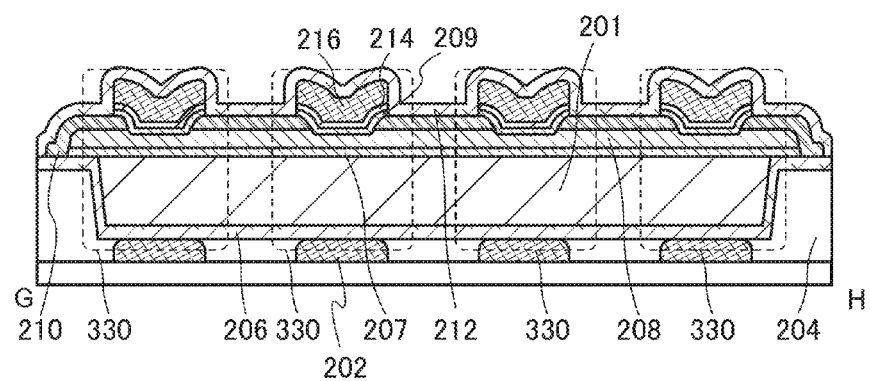

FIGS. 13A to 13D show an example in which the groove in the insulating layer 204 is filled by the oxide semiconductor layer 208, though this embodiment is not limited to this example. For example, as illustrated in FIGS. 14A and 14B, the groove in the insulating layer 204 may be filled by the insulating layer 201 with the insulating layer 206 interposed therebetween. FIG. 14A is a top view of transistors 330 connected in series, and FIG. 14B is a cross-sectional view taken along line G-H in FIG. 14A.

As illustrated in FIG. 14B, the transistors 330 include in common the insulating layer 206 provided over the insulating layer 204 so as to cover the groove in the insulating layer 204; the insulating layer 201 which fills the groove with the insulating layer 206 interposed therebetween; and the first oxide layer 207 and the oxide semiconductor layer 208 which have an island shape and are in contact with the top surface of the insulating layer 201. The two adjacent transistors 330 share the electrode 210 and thus are connected in series. On the other hand, the first gate electrode layer 202 and the second gate electrode layer 216 are provided independently for each of the transistors 330. In addition, the second oxide layer 209 and the insulating layer 214 between the second gate electrode layer 216 and the oxide semiconductor layer 208 are etched using the second gate electrode layer 216 as a mask, and thus are provided independently for each of the transistors 330.

The insulating layer 206 and the insulating layer 212 are provided to surround the four transistors 330 and in contact with each other outside the electrodes 210 on both ends of the groove.

The insulating layer 201 included in the transistor 330, which is in contact with the oxide semiconductor layer 208, preferably contains excess oxygen so that oxygen can be supplied to the oxide semiconductor layer 208. It is also preferable that the insulating layer 201 have a lower hydrogen concentration.

For the other components of the transistor 330, the description of Embodiment 4 or FIGS. 13A to 13D can be referred to.

In this embodiment, the transistor 290 or 330 shown in Embodiment 3 is used as an example; however, one embodiment of the present invention is not limited to this example and the other transistors shown in the above embodiments may be used as appropriate.

This embodiment can be combined with any of the other embodiments in this specification as appropriate.

(Embodiment 8)

In this embodiment, examples of a circuit using the transistor shown in any of the above embodiments will be described with reference to drawings.

Figure 15A:
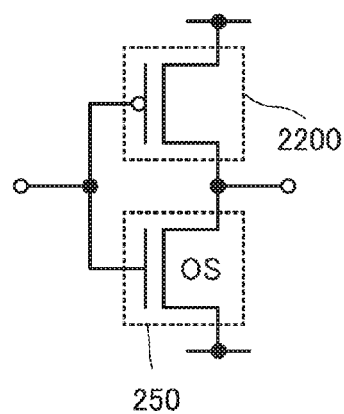
FIGS. 15A to 15C illustrate examples of a semiconductor device.
Figure 15B:
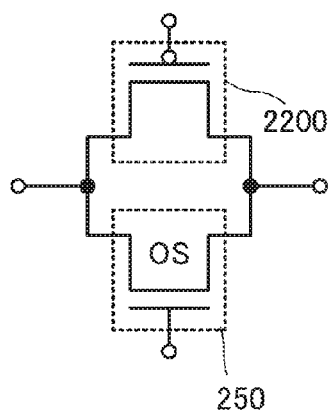
Figure 15C:
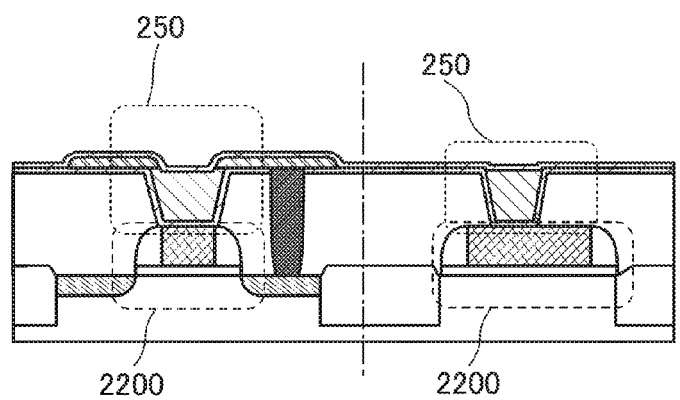

FIG. 15A is a circuit diagram of a semiconductor device and FIG. 15C is a cross-sectional view of the semiconductor device. The left side of FIG. 15C is a cross-sectional view of the transistor 250 in the channel length direction and the right side is a cross-sectional view of the transistor 250 in the channel width direction. In the circuit diagram, OS denotes a transistor including an oxide semiconductor.

In the semiconductor device illustrated in FIG. 15C, a transistor 2200 including a first semiconductor material is provided in a lower portion and a transistor including a second semiconductor material is provided in an upper portion. Described here is an example of using the transistor 250 shown in Embodiment 1 as the transistor including the second semiconductor material.

Here, the first semiconductor material and the second semiconductor material preferably have different band gaps. For example, the first semiconductor material can be a semiconductor material (such as silicon, germanium, silicon germanium, silicon carbide, or gallium arsenide) other than an oxide semiconductor, and the second semiconductor material can be any of the oxide semiconductors described in Embodiment 1. A transistor including, for example, single crystal silicon as a material other than an oxide semiconductor can operate at high speed easily. On the other hand, a transistor including an oxide semiconductor has a low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here, except for the use of the transistor including an oxide semiconductor described in Embodiment 1 or 2.

FIGS. 15A and 15C illustrate a configuration example of what is called a CMOS circuit, in which a p-channel transistor and an n-channel transistor are connected in series and gates of the transistors are connected.

As illustrated in FIG. 15C, the transistor 250 is stacked over the transistor 2200. The stack of the two transistors reduces the area occupied by the circuit, allowing a plurality of circuits to be highly integrated. In addition, the gate electrode layer of the transistor 250 can be used in common with a gate electrode layer of the transistor 2200. This is effective for higher integration of the semiconductor device and shortening of manufacturing process of the semiconductor device.

In FIG. 15C, one of the source and the drain of the transistor 250 is electrically connected to one of a source and a drain of the transistor 2200 via a plug.

The transistor including the oxide semiconductor of one embodiment of the present invention has an increased on-state current, which enables high speed operation of the circuit.

When the connection between the electrodes of the transistor 250 and the transistor 2200 is changed from that in the configuration illustrated in FIG. 15C, a variety of circuits can be formed. For example, as illustrated in FIG. 15B, one of the source and the drain of the transistor 250 is connected to one of the source and the drain of the transistor 2200 and the other of the source and the drain of the transistor 250 is connected to the other of the source and the drain of the transistor 2200, whereby what is called an analog switch can be obtained.

This embodiment can be combined with any of the other embodiments in this specification as appropriate.

(Embodiment 9)

In this embodiment, examples of a circuit using the transistor shown in any of the above embodiments will be described with reference to drawings.

Figure 16A:
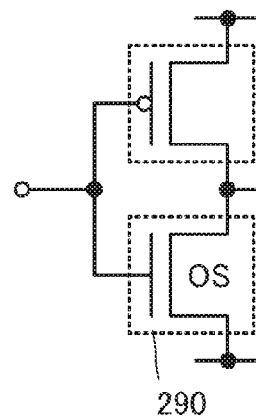
FIGS. 16A to 16C illustrate examples of a semiconductor device.
Figure 16B:
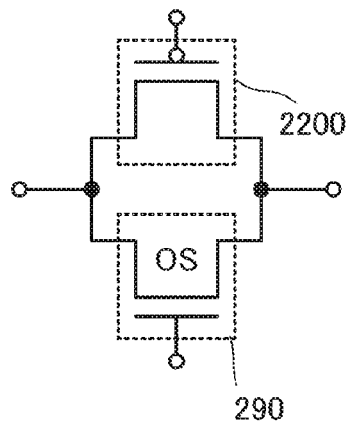
Figure 16C:
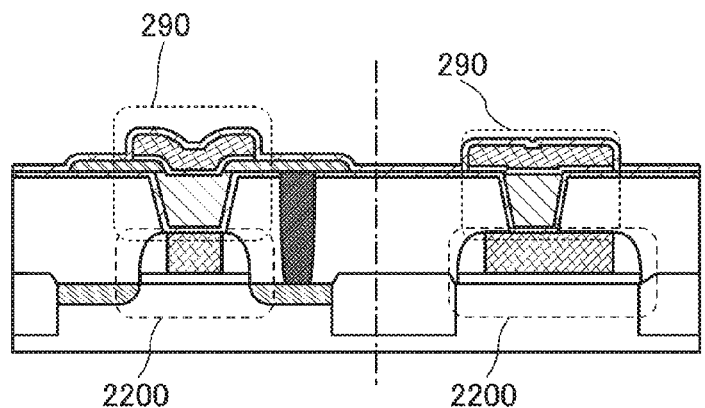

FIG. 16A is a circuit diagram of a semiconductor device and FIG. 16C is a cross-sectional view of the semiconductor device. The left side of FIG. 16C is a cross-sectional view of the transistor 290 in the channel length direction and the right side is a cross-sectional view of the transistor 290 in the channel width direction. In the circuit diagram, OS denotes a transistor including an oxide semiconductor. The structure of FIGS. 16A to 16C is similar to that in Embodiment 8, except for the components described below.

In the semiconductor device illustrated in FIG. 16C, the transistor 2200 including a first semiconductor material is provided in a lower portion and a transistor including a second semiconductor material is provided in an upper portion. Described here is an example of using the transistor 290 shown in Embodiment 3 as the transistor including the second semiconductor material.

FIGS. 16A and 16C illustrate a configuration example of what is called a CMOS circuit, in which a p-channel transistor and an n-channel transistor are connected in series and gates of the transistors are connected.

As illustrated in FIG. 16C, the transistor 290 is stacked over the transistor 2200. The stack of the two transistors reduces the area occupied by the circuit, allowing a plurality of circuits to be highly integrated. In addition, the first gate electrode layer of the transistor 290 can be used in common with the gate electrode layer of the transistor 2200. This is effective for higher integration of the semiconductor device and shortening of manufacturing process of the semiconductor device.

In FIG. 16C, one of the source and the drain of the transistor 290 is electrically connected to one of the source and the drain of the transistor 2200 via a plug.

When the connection between the electrodes of the transistor 290 and the transistor 2200 is changed from that in the configuration illustrated in FIG. 16C, a variety of circuits can be formed. For example, as illustrated in FIG. 16B, one of the source and the drain of the transistor 290 is connected to one of the source and the drain of the transistor 2200 and the other of the source and the drain of the transistor 290 is connected to the other of the source and the drain of the transistor 2200, whereby what is called an analog switch can be obtained.

This embodiment can be combined with any of the other embodiments in this specification as appropriate.

(Embodiment 10)

In this embodiment, an example of a semiconductor device (memory device) using the transistor shown in any of the above embodiments will be described with reference to drawings. The semiconductor device (memory device) can retain data even when not powered, and has an unlimited number of write cycles.

Figure 17:
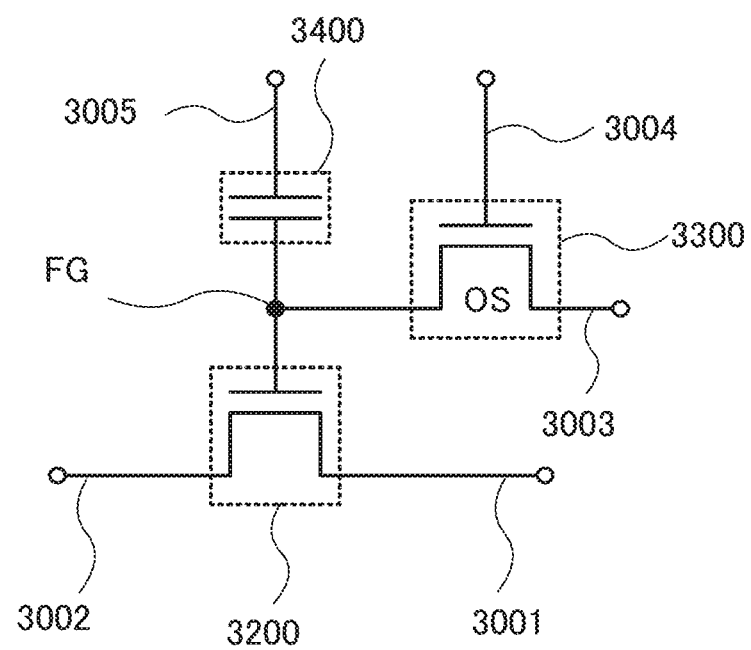
FIG. 17 is a circuit diagram illustrating an example of a semiconductor device.

FIG. 17 is a circuit diagram of the semiconductor device.

The semiconductor device illustrated in FIG. 17 includes a transistor 3200 using a first semiconductor material, a transistor 3300 using a second semiconductor material, and a capacitor 3400. Note that the transistor shown in Embodiments 1 to 4 can be used as the transistor 3300. In FIG. 17, "OS" is written beside the transistor 3300 so as to identify the transistor 3300 as including an oxide semiconductor.

The transistor 3300 includes a channel formed in a semiconductor layer including an oxide semiconductor. Since the off-state current of the transistor 3300 is low, stored data can be retained for a long period using such a transistor. In other words, it is possible to obtain a semiconductor memory device that does not need refresh operation or has an extremely low frequency of refresh operation, and thus has a sufficiently low power consumption.

In FIG. 17, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

In the semiconductor device in FIG. 17, the potential of the gate electrode of the transistor 3200 can be retained, whereby writing, retaining, and reading of data can be performed as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely low, the charge of the gate electrode of the transistor 3200 is held for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in general, in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Thus, the data retained in the gate electrode can be read by determining the potential of the second wiring 3002.

Note that in the case where memory cells are arrayed, it is necessary that only data of a desired memory cell be able to be read. In the case where data is not read, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device described in this embodiment includes a transistor having a channel formation region using an oxide semiconductor and thus having an extremely low off-state current; accordingly, data can be retained for an extremely long time. In other words, it is possible to obtain a semiconductor device that does not need refresh operation or has an extremely low frequency of refresh operation, and thus has a sufficiently low power consumption. Moreover, stored data can be retained for a long time even when power is not supplied (note that a potential is preferably fixed).

Furthermore, in the semiconductor device of this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer does not occur. That is, in the semiconductor device of the disclosed invention, there is no limitation on the number of times of rewriting unlike in a conventional nonvolatile memory. As a result, the reliability of the semiconductor device is drastically improved. Moreover, data is written depending on the state of the transistor (on or off), whereby high-speed operation can be easily achieved.

As described above, a miniaturized and highly integrated semiconductor device having high electrical characteristics can be provided.

This embodiment can be combined with any of the other embodiments in this specification as appropriate.

(Embodiment 11)

Described in this embodiment is a CPU which can employ the transistor shown in any of the above embodiments and includes the memory device described in the preceding embodiment.

Figure 18:
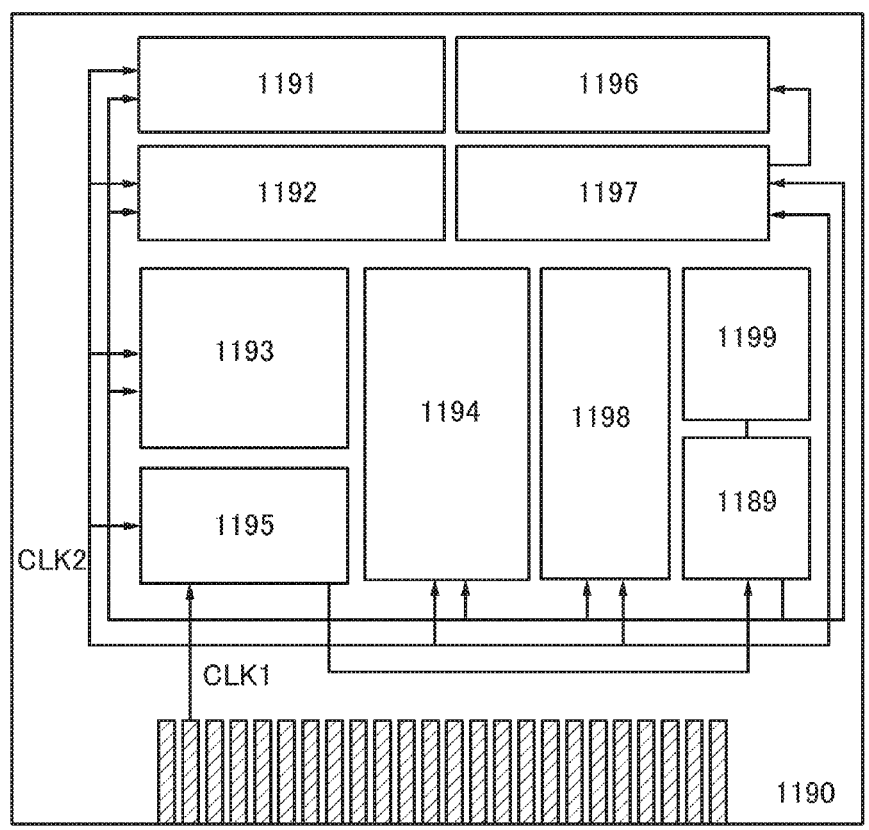
FIG. 18 is a block diagram illustrating an example of a semiconductor device.

FIG. 18 is a block diagram illustrating a configuration example of a CPU at least partly including the transistor shown in Embodiment 1 or 2.

The CPU illustrated in FIG. 18 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface ROM I/F) 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 18 is just an example in which the configuration has been simplified, and an actual CPU may have various configurations depending on the application. For example, the CPU may have the following configuration: a structure including the CPU illustrated in FIG. 18 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 18, a memory cell is provided in the register 1196. The transistor described in any of the above embodiments can be used in the memory cell of the register 1196.

In the CPU illustrated in FIG. 18, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 19:
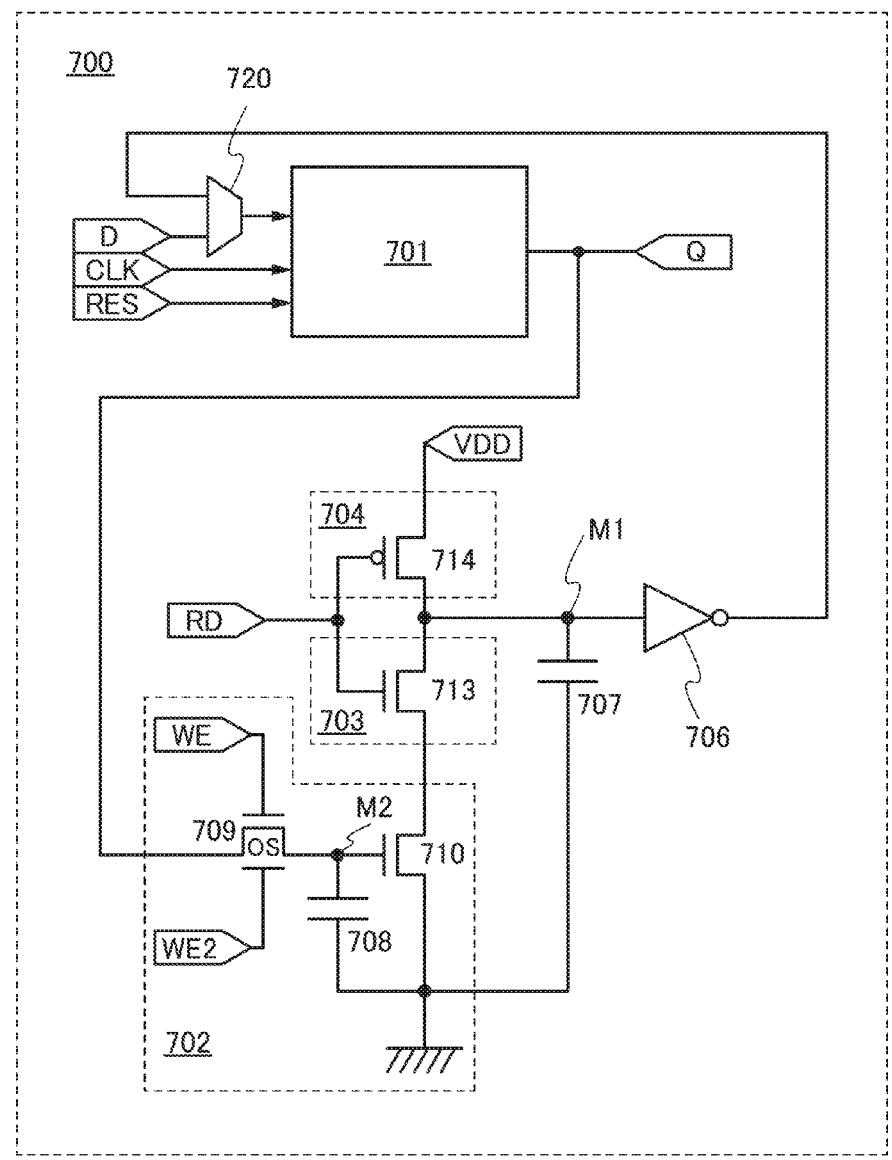
FIG. 19 is a circuit diagram illustrating an example of a semiconductor device.

FIG. 19 is an example of a circuit diagram of a memory element that can be used as the register 1196. A memory element 700 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in the preceding embodiment can be used as the circuit 702. When supply of a power supply voltage to the memory element 700 is stopped, a ground potential (0 V) or a potential at which the transistor 709 in the circuit 702 is turned off continues to be input to a gate of the transistor 709. For example, the gate of the transistor 709 is grounded through a load such as a resistor.

Shown here is an example in which the switch 703 is a transistor 713 having one conductivity type (e.g., an n-channel transistor) and the switch 704 is a transistor 714 having a conductivity type opposite to the one conductivity type (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a (ND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 19 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 19, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where the circuit 701 includes a node in which a signal obtained by inversion of the logic value of a signal input from the input terminal is retained, the signal output from the second terminal of the switch 703 (the other of the source and the drain of the transistor 713) can be input to the node.

As the transistor 709 in FIG. 19, the transistor described in any of Embodiments 1 to 4 can be used. The control signal WE can be input to a first gate and the control signal WE2 can be input to a second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 can be further reduced.

In FIG. 19, the transistors included in the memory element 700 except for the transistor 709 can each be a transistor in which a channel is formed in a layer formed using a semiconductor other than an oxide semiconductor or in the substrate 1190. For example, a channel of transistor can be formed in a silicon layer or a silicon substrate. Alternatively, all the transistors in the memory element 700 may be a transistor in which a channel is formed in an oxide semiconductor layer. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 19, for example, a flip-flop circuit can be used. As the logic element 706, for example, an inverter or a clocked inverter can be used.

In a period during which the memory element 700 is not supplied with the power supply voltage, the semiconductor device of one embodiment of the present invention can retain data stored in the circuit 701 by the capacitor 708 which is provided in the circuit 702.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the transistor 709, a signal held in the capacitor 708 is retained for a long time also in a period during which the power supply voltage is not supplied to the memory element 700. The memory element 700 can accordingly retain the stored content (data) also in a period during which the supply of the power supply voltage is stopped.

The memory element performs pre-charge operation with the switch 703 and the switch 704, shortening the time required for the circuit 701 to retain original data again after the supply of the power supply voltage is restarted.

In the circuit 702, a signal retained by the capacitor 708 is input to the gate of the transistor 710. Therefore, after supply of the power supply voltage to the memory element 700 is restarted, the signal retained by the capacitor 708 can be converted into the one corresponding to the state (the on state or the off state) of the transistor 710 to be read from the circuit 702. Consequently, an original signal can be accurately read even when a potential corresponding to the signal retained by the capacitor 708 varies to some degree.

By applying the above-described memory element 700 to a memory device such as a register or a cache memory included in a processor, data in the memory device can be prevented from being lost owing to the stop of supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 700 is used in a CPU in this embodiment, the memory element 700 can also be used in an LSI such as a digital signal processor (DSP), a custom LSI, or a programmable logic device (PLD), and a radio frequency identification (RF-ID).

This embodiment can be combined with any of the other embodiments in this specification as appropriate.

(Embodiment 12)

Described in this embodiment is a semiconductor device having an image sensor function for reading data of an object and including a transistor shown in any of the above embodiments.

Figure 20:
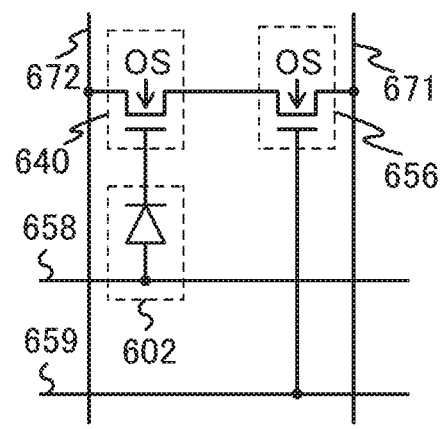
FIG. 20 is a circuit diagram illustrating an example of a semiconductor device.

FIG. 20 illustrates an example of an equivalent circuit of a semiconductor device having an image sensor function.

One electrode of a photodiode 602 is electrically connected to a photodiode reset signal line 658, and the other electrode is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

The photodiode 602 can be, for example, a pin photodiode in which a p-type semiconductor layer, a high-resistance (i-type) semiconductor layer, and an n-type semiconductor layer are stacked.

With detection of light that enters the photodiode 602, data of an object can be read. Note that a light source such as a backlight can be used at the time of reading data of an object.

Note that the transistor shown in any of Embodiments 1 to 4, which includes a cannel formed in an oxide semiconductor, can be used as the transistor 640 and the transistor 656. In FIG. 20, "OS" is written beside the transistors 640 and 656 so as to identify the transistors as including an oxide semiconductor.

Each of the transistors 640 and 656 is the one shown in the above embodiments, in which the oxide semiconductor layer including the channel is surrounded by the insulating layers including an aluminum oxide film containing excess oxygen. In addition, the oxide semiconductor layer is preferably electrically covered with the gate electrode layer. As a result, the transistors 640 and 656 have little variation in electrical characteristics and are electrically stable. With use of these transistors, the semiconductor device having an image sensor function illustrated in FIG. 20 can have high reliability.

This embodiment can be combined with any of the other embodiments in this specification as appropriate.

(Embodiment 13)

Described in this embodiment are examples of an electronic device to which the transistor, the memory device, or the CPU and the like (including a DSP, a custom LSI, a PLD, and an RF-ID) described in the above embodiments can be applied to.

The transistor, the memory device, the CPU, and the like described in the above embodiments can be applied to a variety of electronic devices (including game machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. In addition, the examples of the electronic devices include alarm devices such as smoke detectors, heat detectors, gas alarm devices, and security alarm devices. Furthermore, the examples of the electronic devices also include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 21A to 21C.

Figure 21A:
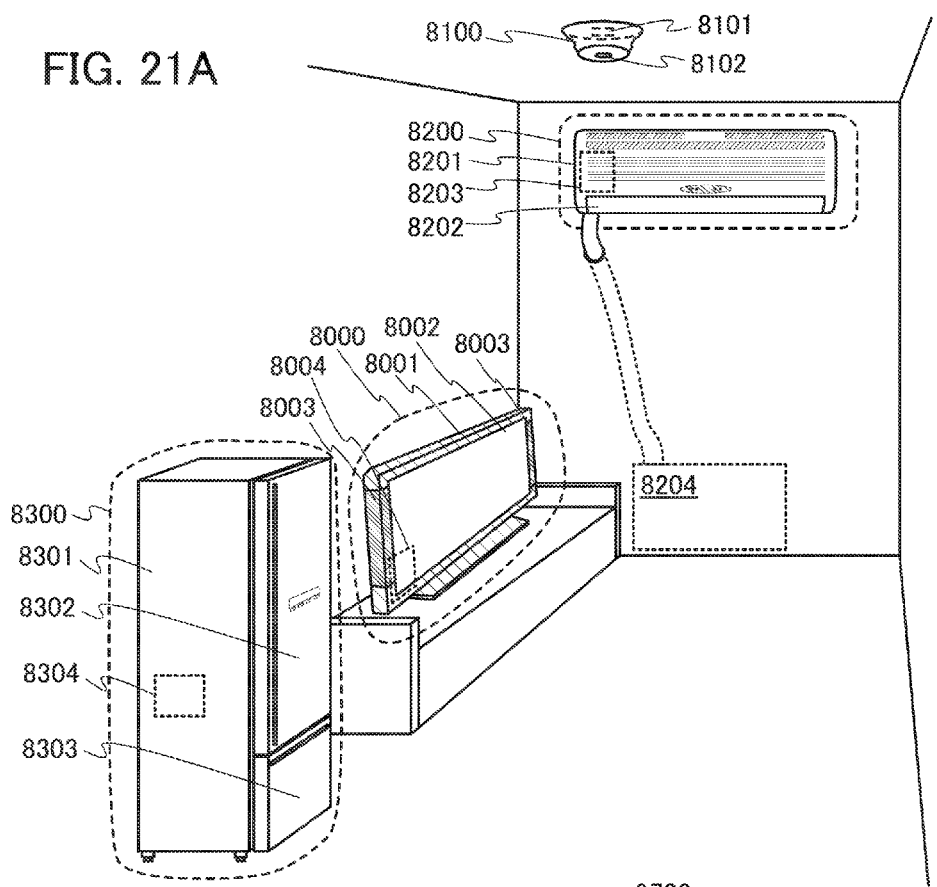
FIGS. 21A to 21C illustrate embodiments of electronic devices.
Figure 21B:
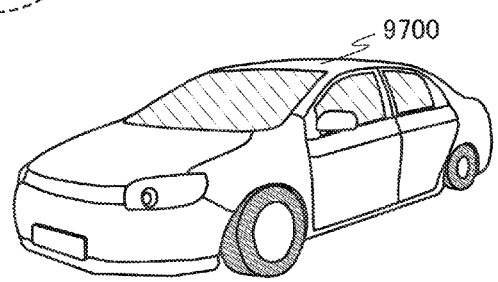
Figure 21C:
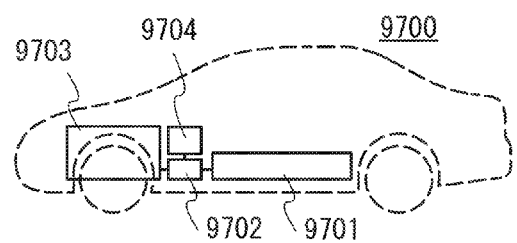

In a television set 8000 illustrated in FIG. 21A, a display portion 8002 is incorporated in a housing 8001. The display portion 8002 can display an image and a speaker portion 8003 can output sound. Any of the transistors described in the above embodiments can be used in a pixel or a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, a general television broadcast can be received. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU 8004 for performing information communication or a memory. Any of the transistors, the memory device, and the CPU described in the above embodiments is used for the CPU 8004 or the memory, whereby power consumption can be reduced.

An alarm device 8100 illustrated in FIG. 21A is a residential tire alarm, which includes a sensor portion 8102 for smoke or heat and a microcomputer 8101. Note that the microcomputer 8101 includes the transistor, the memory device, or the CPU described in any of the above embodiments.

An air conditioner which includes an indoor unit 8200 and an outdoor unit 8204 illustrated in FIG. 21A is an example of an electronic device including the transistor, the memory device, the CPU, or the like described in any of the above embodiments. Specifically, the indoor unit 8200 includes a housing 8201, an air outlet 8202, a CPU 8203, and the like. Although the CPU 8203 is provided in the indoor unit 8200 in FIG. 21A, the CPU 8203 may be provided in the outdoor unit 8204. Alternatively, the CPU 8203 may be provided in both the indoor unit 8200 and the outdoor unit 8204. By using the transistor described in any of the above embodiments for the CPU in the air conditioner, a reduction in the power consumption of the air conditioner can be achieved.

An electric refrigerator-freezer 8300 illustrated in FIG. 21A is an example of an electronic device including the transistor, the memory device, the CPU, or the like described in any of the above embodiments. Specifically, the electric refrigerator-freezer 8300 includes a housing 8301, a door for a refrigerator 8302, a door for a freezer 8303, a CPU 8304, and the like. In FIG. 21A, the CPU 8304 is provided in the housing 8301. When the transistor described in any of the above embodiments is used in the CPU 8304 of the electric refrigerator-freezer 8300, a reduction in the power consumption of the electric refrigerator-freezer 8300 can be achieved.

FIGS. 21B and 21C illustrate an example of an electric vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When any of the transistors described in the above embodiments is used for the CPU in the electric vehicle 9700, a reduction in the power consumption of the electric vehicle 9700 can be achieved.

The driving device 9703 includes a DC motor or an AC motor either alone or in combination with an internal-combustion engine. The processing unit 9704 outputs a control signal to the circuit 9702 in accordance with input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined with any of the other embodiments in this specification as appropriate.

This application is based on Japanese Patent Application serial No. 2013-106359 filed with Japan Patent Office on May 20, 2013 and Japanese Patent Application serial No. 2013-106378 filed with Japan Patent Office on May 20, 2013, the entire contents of which are hereby incorporated by reference.

What is claimed is:

1. A semiconductor device comprising:
    a first insulating layer including a groove;
    a first electrode in the groove;
    a second insulating layer over the first electrode;
    an oxide semiconductor layer over the second insulating layer;
    a second electrode and a third electrode over the oxide semiconductor layer;
    a third insulating layer over the oxide semiconductor layer, the second electrode, and the third electrode;
    a fourth electrode over the third insulating layer; and
    a fourth insulating layer over the fourth electrode,
    wherein:
    the second insulating layer and the fourth insulating layer each contain an aluminum oxide film, and
    the oxide semiconductor layer, the second electrode, the third electrode, the third insulating layer, and the fourth electrode are surrounded by the second insulating layer and the fourth insulating layer.

2. The semiconductor device according to claim 1, wherein:
    the first electrode and the fourth electrode function as a gate, and
    the second electrode and the third electrode respectively function as a source and a drain.

3. The semiconductor device according to claim 1, wherein the second insulating layer is in contact with side surfaces of the oxide semiconductor layer.

4. The semiconductor device according to claim 1, wherein the second insulating layer and the oxide semiconductor layer are in the groove.

5. The semiconductor device according to claim 1, wherein the oxide semiconductor layer is in contact with the second electrode and the third electrode.

6. The semiconductor device according to claim 1, wherein the second insulating layer and the fourth insulating layer are in contact with each other.

7. The semiconductor device according to claim 1, wherein the aluminum oxide film contains excess oxygen.

8. A semiconductor device comprising:
    a first insulating layer including a groove;
    a first electrode, a second electrode, and a third electrode in the groove;
    a second insulating layer over the first electrode, the second electrode, and the third electrode;
    an oxide semiconductor layer over the second insulating layer;
    a third insulating layer over the oxide semiconductor layer;
    a fourth electrode over the third insulating layer; and
    a fourth insulating layer over the fourth electrode,
    wherein:
    the second insulating layer and the fourth insulating layer each contain an aluminum oxide film, and
    the oxide semiconductor layer, the third insulating layer, and the fourth electrode are surrounded by the second insulating layer and the fourth insulating layer.

9. The semiconductor device according to claim 8, wherein the first electrode, the second electrode, the third electrode, and the fourth electrode function as a gate.

10. The semiconductor device according to claim 8, wherein the second insulating layer is in contact with side surfaces of the oxide semiconductor layer.

11. The semiconductor device according to claim 8, wherein the second insulating layer and the oxide semiconductor layer are in the groove.

12. The semiconductor device according to claim 8, further comprising a fifth electrode and a sixth electrode over the oxide semiconductor layer.

13. The semiconductor device according to claim 12, wherein the fifth electrode and the sixth electrode respectively function as a source and a drain.

14. The semiconductor device according to claim 12, wherein the oxide semiconductor layer is in contact with the fifth electrode and the sixth electrode.

15. The semiconductor device according to claim 8, wherein the second insulating layer and the fourth insulating layer are in contact with each other.

16. The semiconductor device according to claim 8, wherein the aluminum oxide film contains excess oxygen.

* * * * *